(12) United States Patent
Yoshikawa

(10) Patent No.: US 12,342,546 B2
(45) Date of Patent: Jun. 24, 2025

(54) SEMICONDUCTOR MEMORY DEVICE INCLUDING AN INSULATING PORTION HAVING A VARYING WIDTH

(71) Applicant: Kioxia Corporation, Tokyo (JP)

(72) Inventor: Namiki Yoshikawa, Suzuka (JP)

(73) Assignee: Kioxia Corporation, Tokyo (JP)

( * ) Notice: Subject to any disclaimer, the term of this patent is extended or adjusted under 35 U.S.C. 154(b) by 404 days.

(21) Appl. No.: 17/189,347

(22) Filed: Mar. 2, 2021

(65) Prior Publication Data

US 2022/0077173 A1 Mar. 10, 2022

(30) Foreign Application Priority Data

Sep. 4, 2020 (JP) .................................. 2020-149394

(51) Int. Cl.
| | |
|---|---|
| *H10B 43/50* | (2023.01) |
| *H01L 23/522* | (2006.01) |
| *H10B 41/27* | (2023.01) |
| *H10B 41/50* | (2023.01) |
| *H10B 43/27* | (2023.01) |

(52) U.S. Cl.
CPC .......... *H10B 43/50* (2023.02); *H01L 23/5226* (2013.01); *H10B 41/27* (2023.02); *H10B 41/50* (2023.02); *H10B 43/27* (2023.02)

(58) Field of Classification Search
CPC ........ H10B 43/50; H10B 41/27; H10B 41/50; H10B 43/27; H10B 43/35; H10B 41/35; H01L 23/5226
See application file for complete search history.

(56) References Cited

U.S. PATENT DOCUMENTS

| | | | |
|---|---|---|---|
| 10,903,234 B2* | 1/2021 | Yun ........................ | H10B 43/35 |
| 2017/0243817 A1 | 8/2017 | Yamashita | |
| 2018/0151672 A1 | 5/2018 | Choi et al. | |
| 2019/0252397 A1 | 8/2019 | Sakamoto et al. | |
| 2019/0371811 A1 | 12/2019 | Oike | |
| 2020/0251488 A1* | 8/2020 | Iwai ........................ | H10B 43/27 |
| 2020/0251489 A1 | 8/2020 | Tsutsum et al. | |
| 2020/0303397 A1* | 9/2020 | Cui ......................... | H10B 43/50 |
| 2020/0312863 A1* | 10/2020 | Iwai ....................... | H10B 43/10 |
| 2021/0305384 A1* | 9/2021 | Cui ................... | H01L 29/40117 |
| 2021/0313281 A1* | 10/2021 | Kaminaga .............. | H10B 43/10 |

\* cited by examiner

*Primary Examiner* — Kimberly N Rizkallah
*Assistant Examiner* — Zhijun Xu
(74) *Attorney, Agent, or Firm* — Oblon, McClelland, Maier & Neustadt, L.L.P.

(57) ABSTRACT

A semiconductor memory device includes: a plurality of first conductive layers disposed in a first direction; a structure that includes a first semiconductor layer extending in the first direction and being opposed to the plurality of first conductive layers, agate insulating layer being disposed between the first semiconductor layer and the plurality of first conductive layers, and a second semiconductor layer being contact to one end portion of the first semiconductor layer; a contact connected to the second semiconductor layer; an insulating portion that separates a part of the plurality of first conductive layers in a second direction and is in contact with the structure and the contact from one side in the second direction; and a first insulating layer in contact with the contact from the other side in the second direction. The insulating portion includes an insulating material different from a material of the first insulating layer.

22 Claims, 31 Drawing Sheets

US 12,342,546 B2

SEMICONDUCTOR MEMORY DEVICE INCLUDING AN INSULATING PORTION HAVING A VARYING WIDTH

CROSS-REFERENCE TO RELATED APPLICATIONS

This application is based upon and claims the benefit of Japanese Patent Application No. 2020-149394, filed on Sep. 4, 2020, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers, a semiconductor layer opposed to the plurality of conductive layers, and a gate insulating layer disposed between the semiconductor layer and the plurality of conductive layers.

DETAILED DESCRIPTION

Figure 1:
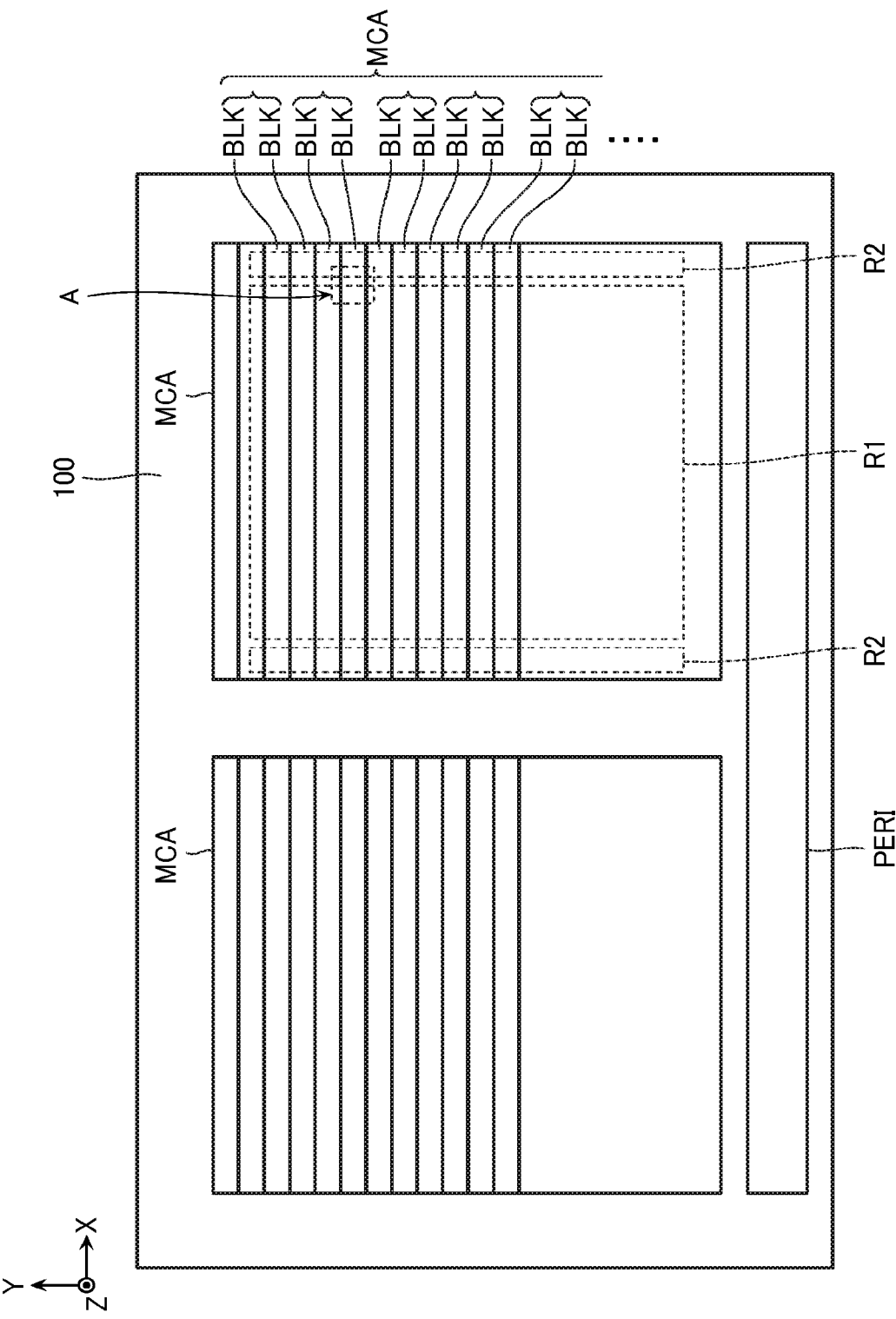
FIG. 1 is a schematic plan view of a semiconductor memory device according to a first embodiment.

A semiconductor memory device according to one embodiment includes: a plurality of first conductive layers disposed to be mutually separated in a first direction; a structure that includes a first semiconductor layer, a gate insulating layer, and a second semiconductor layer, the first semiconductor layer extending in the first direction and being opposed to the plurality of first conductive layers, the gate insulating layer being disposed between the first semiconductor layer and the plurality of first conductive layers, the second semiconductor layer being arranged in one end portion in the first direction of the first semiconductor layer and being connected to the first semiconductor layer; a contact connected to the second semiconductor layer of the structure; an insulating portion that separates a part of the plurality of first conductive layers in a second direction intersecting with the first direction and is in contact with the structure and the contact from one side in the second direction, the part of the plurality of first conductive layers being arranged on one end portion side in the first direction corresponding the one end portion in the first direction of the first semiconductor layer among the plurality of first conductive layers; and a first insulating layer in contact with the contact from the other side in the second direction. The insulating portion includes an insulating material different from an insulating material of the first insulating layer.

Next, semiconductor memory devices according to embodiments are described in detail with reference to the drawings. The following embodiments are only examples, and not described for the purpose of limiting the present invention. The following drawings are schematic, and for sake of convenient description, a part of configurations and the like are sometimes omitted. The same portions in the plurality of drawings are attached by the same reference numerals and their descriptions may be omitted.

In this specification, a direction parallel to a surface of a substrate is referred to as an X-direction, a direction parallel to the surface of the substrate and perpendicular to the X-direction is referred to as a Y-direction, and a direction perpendicular to the surface of the substrate is referred to as a Z-direction. Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration.

In this specification, a "semiconductor memory device" includes various kinds of meanings, such as a memory die, a memory system including a control die, such as a memory chip, a memory card, and an SSD, and a configuration including a host computer, such as a smartphone, a tablet terminal, and a personal computer.

In this specification, a first configuration "is electrically connected" to a second configuration refers that the first configuration is connected to the second configuration directly or via a circuit including a wiring, a semiconductor member, a transistor, and/or the like. For example, when three transistors are connected in series, even when the 2nd transistor is in OFF state, the 1st transistor is "electrically connected" to the third transistor.

First Embodiment

[Configuration]

A configuration of a semiconductor memory device according to a first embodiment is described below with reference to the drawings.

[Configuration of Semiconductor Memory Device]

FIG. 1 is a schematic plan view illustrating an exemplary configuration of the semiconductor memory device according to the first embodiment and illustrates a plane structure of a memory die.

On a substrate 100, a plurality of memory cell arrays MCA and a region PERI are disposed. In the example illustrated in the drawing, the two memory cell arrays MCA are arrayed in an X direction on the substrate 100, and the region PERI is disposed in one end in a Y direction.

The memory cell array MCA includes a plurality of memory blocks BLK disposed in the Y direction. The memory cell array MCA includes a region R1 in which memory cells are disposed and regions R2 in which contacts and the like are disposed in a staircase pattern. The region PERI includes, for example, a part of a peripheral circuit, a pad electrode, and the like.

Figure 2:
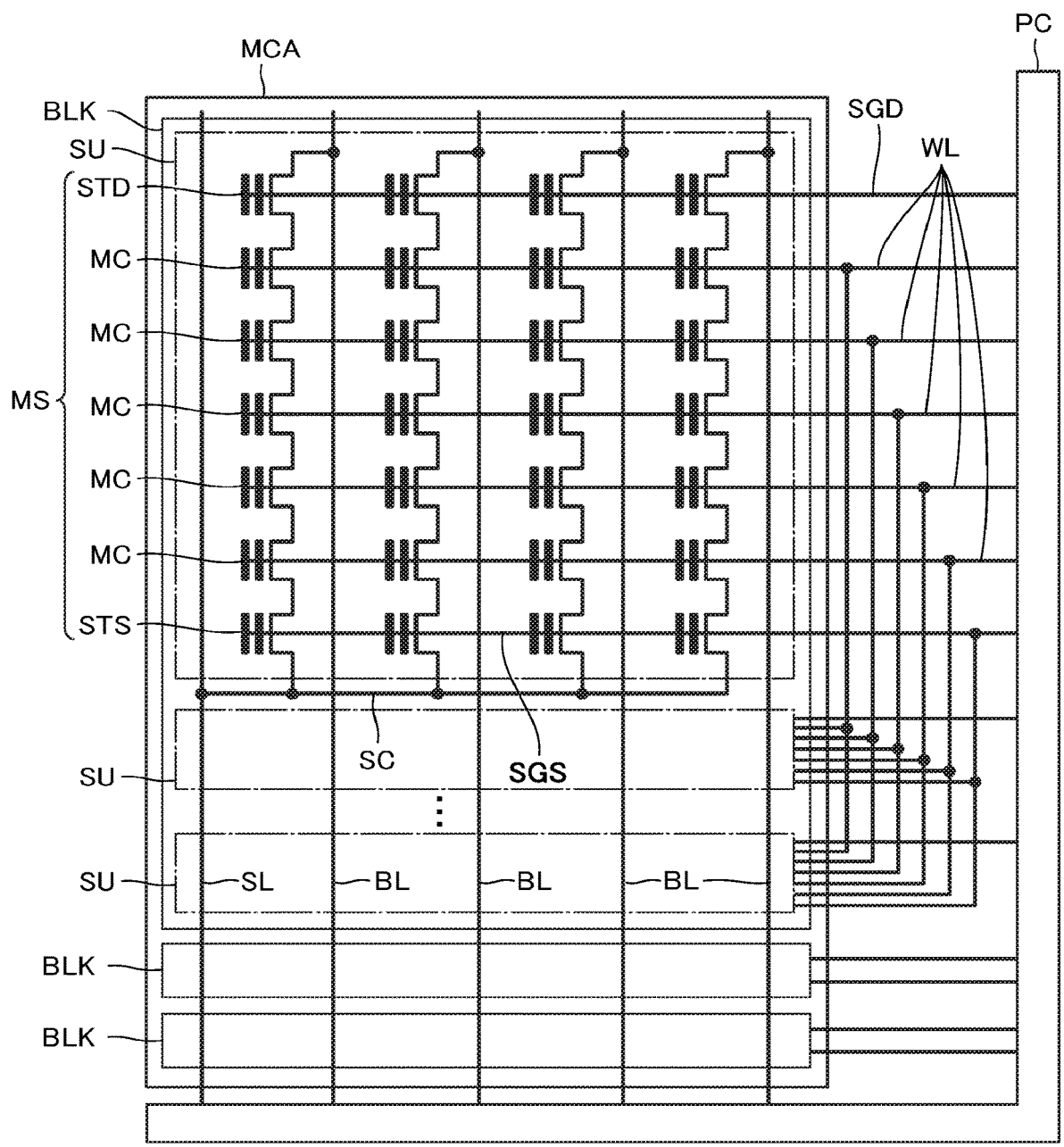
FIG. 2 is an equivalent circuit diagram illustrating a schematic configuration of the semiconductor memory device.

FIG. 2 is a schematic equivalent circuit diagram of this semiconductor memory device.

The plurality of memory blocks BLK constituting the memory cell array MCA each include a plurality of string units SU. The plurality of string units SU each include a plurality of memory strings MS. The plurality of memory strings MS have one ends each connected to a peripheral circuit PC via bit lines BL. The plurality of memory strings MS have other ends each connected to the peripheral circuit PC via a lower wiring SC and a common source line SL.

The memory string MS includes a drain-side select transistor STD, a plurality of memory cells MC (memory transistors) and a source-side select transistor STS, which are connected in series between the bit line BL and the source line SL. Hereinafter, the drain-side select transistor STD and the source-side select transistor STS may be simply referred to as select transistors (STD, STS). While FIG. 2 illustrates one select transistor STD and one select transistor STS, a plurality of select transistors STD and a plurality of select transistors STS may be connected in series.

The memory cell MC is a field-effect type transistor including a semiconductor layer that functions as a channel region, a gate insulating layer including an electric charge accumulating layer, and a gate electrode. The memory cell MC has a threshold voltage that changes according to an electric charge amount in the electric charge accumulating layer. The memory cell MC stores one bit or a plurality of bits of data. Word lines WL are connected to respective gate electrodes of the plurality of memory cells MC corresponding to one memory string MS. These respective word lines WL are connected to all of the memory strings MS in one memory block BLK in common.

The select transistor (STD, STS) is a field-effect type transistor including a semiconductor layer that functions as a channel region, a gate insulating layer, and a gate electrode. Select gate lines (SGD, SGS) are connected to the respective gate electrodes of the select transistors (STD, STS). The drain side select gate line SGD is disposed corresponding to the string unit SU and connected to all of the memory strings MS in one string unit SU in common. The source side select gate line SGS is connected to all of the memory strings MS in the plurality of string units SU in one memory block BLK in common.

[Memory Cell Array MCA]

Figure 3:
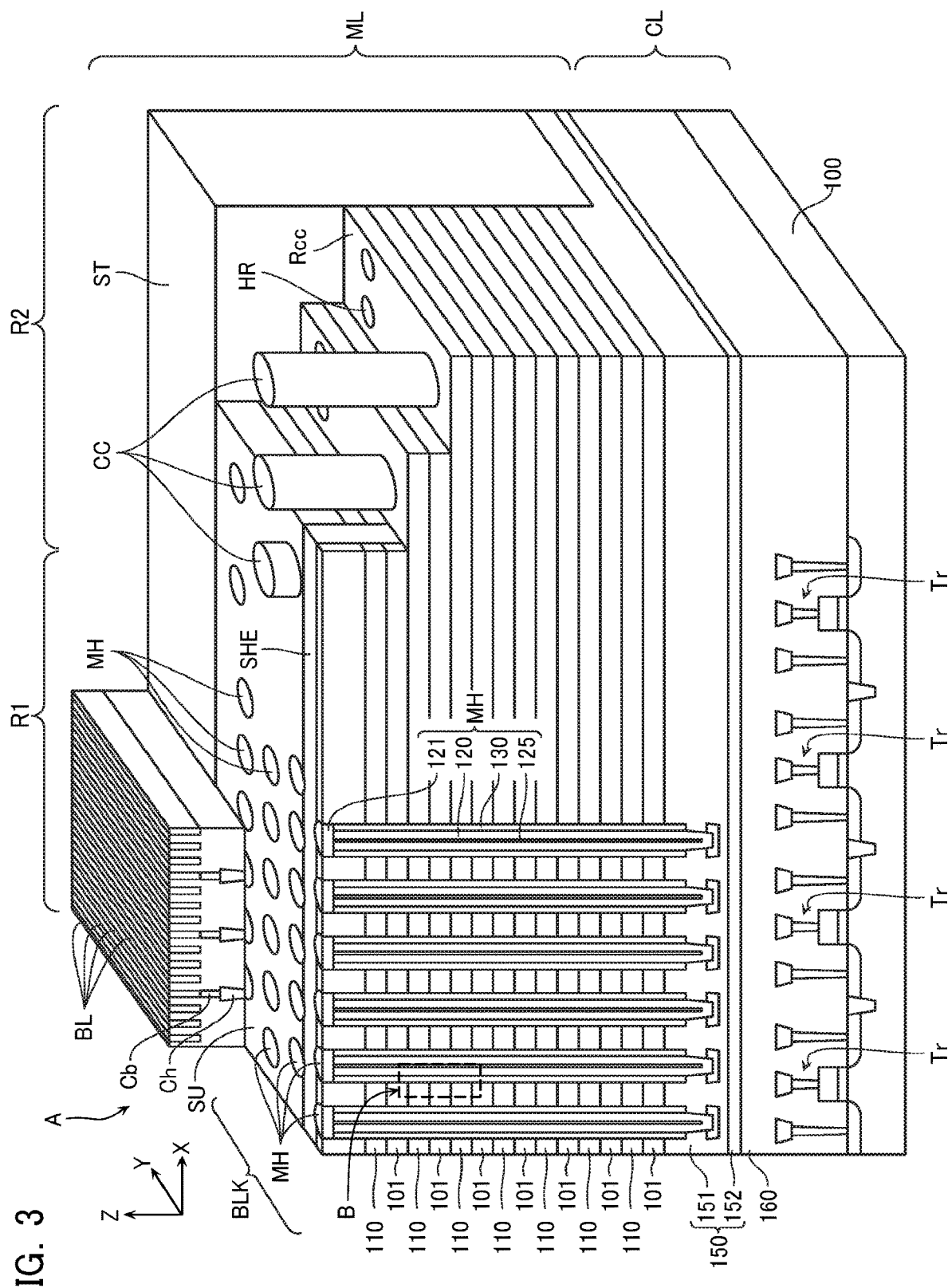
FIG. 3 is a schematic perspective view illustrating the part A in FIG. 1.

FIG. 3 is a schematic perspective view of the part indicated by A in FIG. 1.

The memory cell array MCA includes a memory layer ML and a circuit layer CL disposed below the memory layer ML.

[Memory Layer ML]

An inter-block insulating layer ST extending in the X direction and a Z direction is disposed between two memory blocks BLK adjacent in the Y direction. An insulating portion SHE that separates only the drain side select gate line SGD in the Y direction is disposed between two string units SU adjacent in the Y direction. The insulating portion SHE extends in the X direction and the Z direction.

The memory block BLK includes a plurality of memory structures (structures) MH, a plurality of conductive layers 110, a plurality of insulating layers 101, the plurality of bit lines BL, and a lower wiring layer 150. The plurality of memory structures (structures) MH extend in the Z direction. The plurality of conductive layers 110 are arranged in the Z direction and cover outer peripheral surfaces of the plurality of memory structures MH on an X-Y cross-sectional surface. The plurality of insulating layers 101 are arranged between the plurality of conductive layers 110. The plurality of bit lines BL are connected to upper ends of the memory structures MH. The lower wiring layer 150 is connected to lower ends of the memory structures MH.

The memory structures MH are disposed in a predetermined pattern in the X direction and the Y direction. The memory structure MH includes a semiconductor layer 120 extending in the Z direction, a gate insulating layer 130 disposed between the semiconductor layer 120 and the conductive layer 110, a semiconductor layer 121 connected to an upper end of the semiconductor layer 120, and a core insulating layer 125 disposed in the center part of the memory structure MH.

The semiconductor layer 120 functions as, for example, channel regions of the plurality of memory cells MC, the drain-side select transistor STD, and the source-side select transistor STS, which are included in one memory string MS (FIG. 2). The semiconductor layer 120 has a substantially cylindrical shape integrally formed from a lower end to the upper end. The semiconductor layer 120 is made of, for example, non-doped polycrystalline silicon (Si). The core insulating layer 125, which is embedded in the center part of the semiconductor layer 120, is made of, for example, silicon oxide ($SiO_2$).

The gate insulating layer 130 extends in the Z direction along an outer peripheral surface of the semiconductor layer 120 and has a substantially cylindrical shape integrally formed from a lower end to an upper end excluding a connecting portion between the semiconductor layer 120 and the lower wiring layer 150, which is described later.

The semiconductor layer 121 is made of, for example, polycrystalline silicon (Si) to which N-type impurities, such as phosphorus (P), are doped.

The plurality of conductive layers 110 are disposed in the Z direction via the insulating layers 101 and are substantially plate-shaped conductive films extending in the X direction and the Y direction. The conductive layers 110 as the center portion in the Z direction function as the word lines WL (FIG. 2) and gate electrodes of the plurality of memory cells MC (FIG. 2) connected to these word lines WL.

A part of the conductive layers 110, which is disposed on an upper side among the plurality of conductive layers 110, functions as the drain side select gate line SGD (FIG. 2) and the gate electrodes of the plurality of drain-side select transistors STD (FIG. 2) connected to this drain side select gate line SGD.

A part of the conductive layers 110, which is disposed on a lower side among the plurality of conductive layers 110, functions as the source side select gate line SGS (FIG. 2) and the gate electrodes of the plurality of source-side select transistors STS (FIG. 2) connected thereto.

The respective insulating layers 101 are disposed between the plurality of conductive layers 110 disposed in the Z direction. The insulating layer 101 contains, for example, silicon oxide ($SiO_2$).

The plurality of bit lines BL are disposed in the X direction and extend in the Y direction. The bit line BL is connected to the semiconductor layer 120 via contacts Cb and Ch, and the semiconductor layer 121.

The lower wiring layer 150 includes a semiconductor layer 151 connected to the semiconductor layers 120 and a conductive layer 152 disposed on a lower surface of the semiconductor layer 151. The lower wiring layer 150 functions as the lower wiring SC (FIG. 2).

The conductive layer 152 is formed on the substrate 100 via an insulating layer 160 and includes a conductive film of, for example, a metal, such as tungsten (W), polycrystalline silicon (Si) to which N-type impurities, such as phosphorus (P), are doped, or silicide. The semiconductor layer 151 contains, for example, polycrystalline silicon (Si) to which N-type impurities, such as phosphorus (P), are doped. The insulating layer 160 contains, for example, silicon oxide ($SiO_2$).

[Circuit Layer CL]

The circuit layer CL includes the substrate 100, a plurality of transistors Tr constituting the peripheral circuit PC, a plurality of wirings and contacts connected to the plurality of transistors Tr.

The substrate 100 is a semiconductor substrate made of, for example, single-crystal silicon (Si). The substrate 100 has a double well structure that includes, for example, an N-type impurity layer of phosphorus (P) and the like on a surface of a semiconductor substrate and further a P-type impurity layer of boron (B) and the like in this N-type impurity layer.

[Structure of Memory Cell MC]

Figure 4:
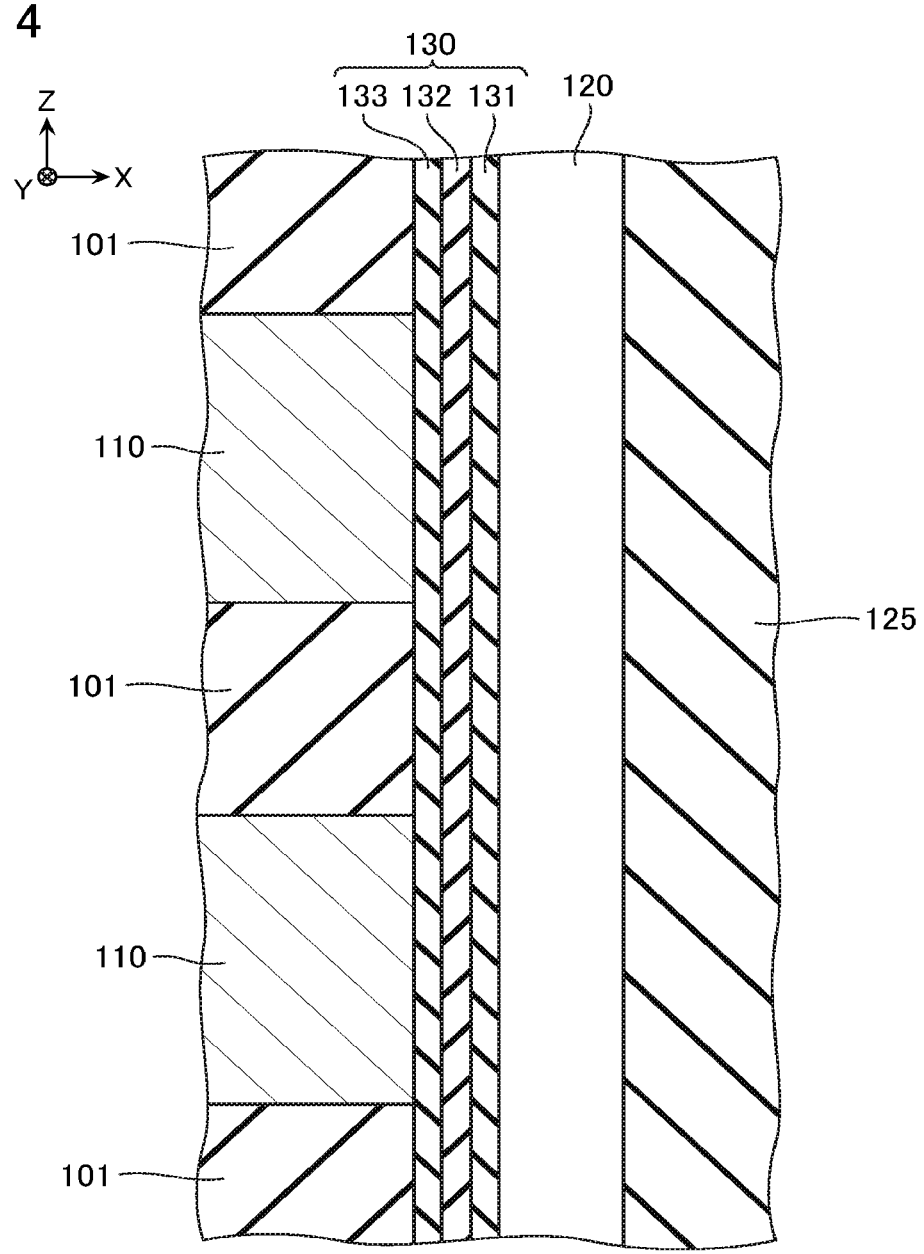
FIG. 4 is an enlarged view of the part B in FIG. 3.

FIG. 4 is a schematic cross-sectional view of the part indicated by B in FIG. 3 and illustrates a detailed structure in a position where the conductive layers 110 and the gate insulating layer 130 are opposed.

As illustrated in FIG. 4, the gate insulating layer 130 includes a tunnel insulating layer 131, an electric charge accumulating layer 132, and a block insulating layer 133 stacked between the semiconductor layer 120 and the conductive layers 110. The tunnel insulating layer 131, the electric charge accumulating layer 132, and the block insulating layer 133 are disposed to be integrally continuous in the Z direction. However, the electric charge accumulating layer 132 may be separated in the Z direction.

The tunnel insulating layer 131 and the block insulating layer 133 contain, for example, silicon oxide ($SiO_2$). The electric charge accumulating layer 132 is a layer that can accumulate an electric charge made of, for example, silicon nitride (SiN). The electric charge accumulating layer 132 may be a floating gate containing, for example, polycrystalline silicon (Si) to which N-type impurities, such as phosphorus (P), or P-type impurities, such as boron (B), are doped.

The conductive layer 110 includes a metal film of, for example, tungsten (W) or molybdenum (Mo). An outer peripheral surface of the conductive layer 110 may be covered with a barrier metal film of, for example, titanium nitride (TiN).

Figure 5:
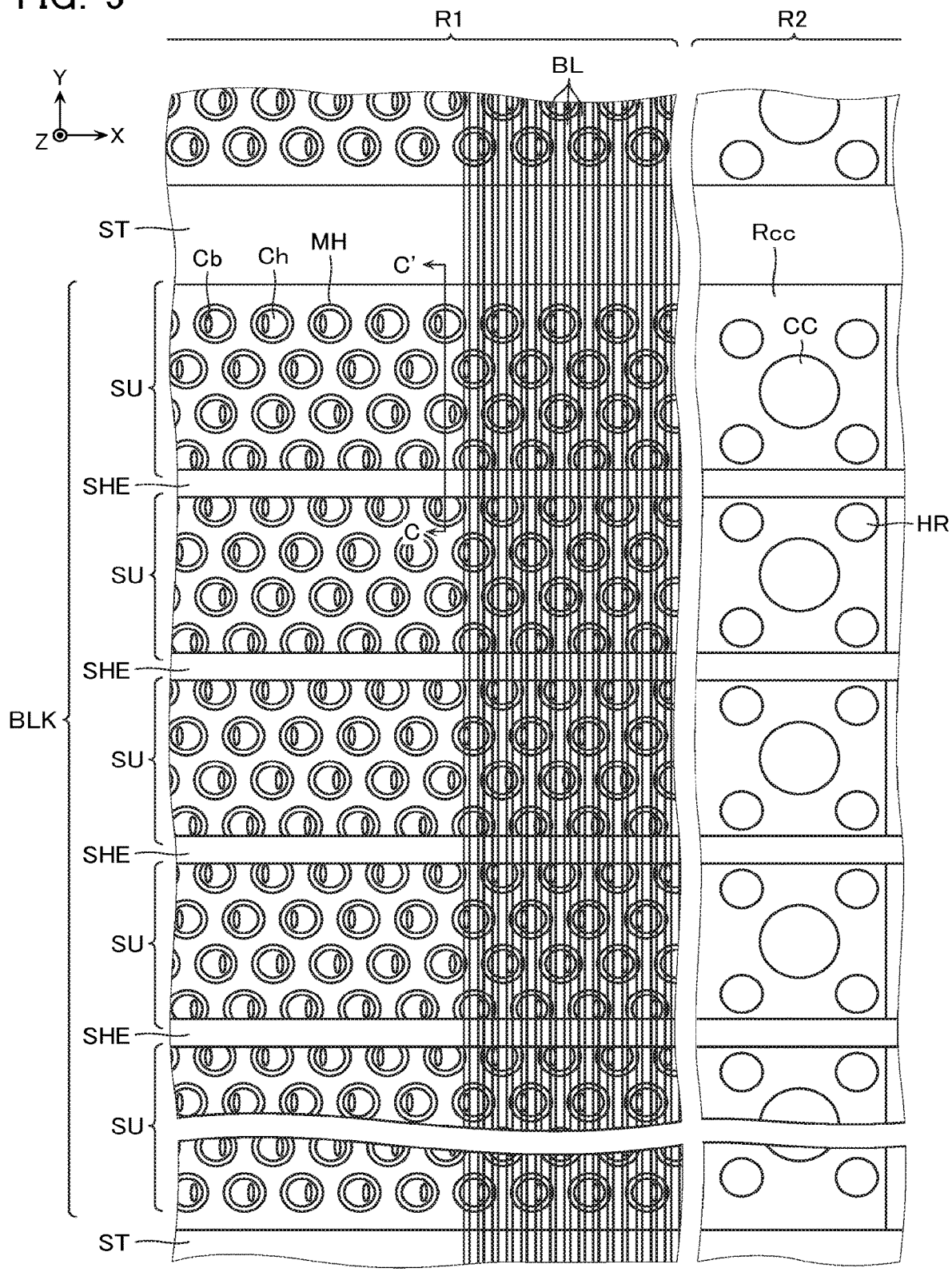
FIG. 5 is an enlarged view of the part A in FIG. 1.
Figure 6:
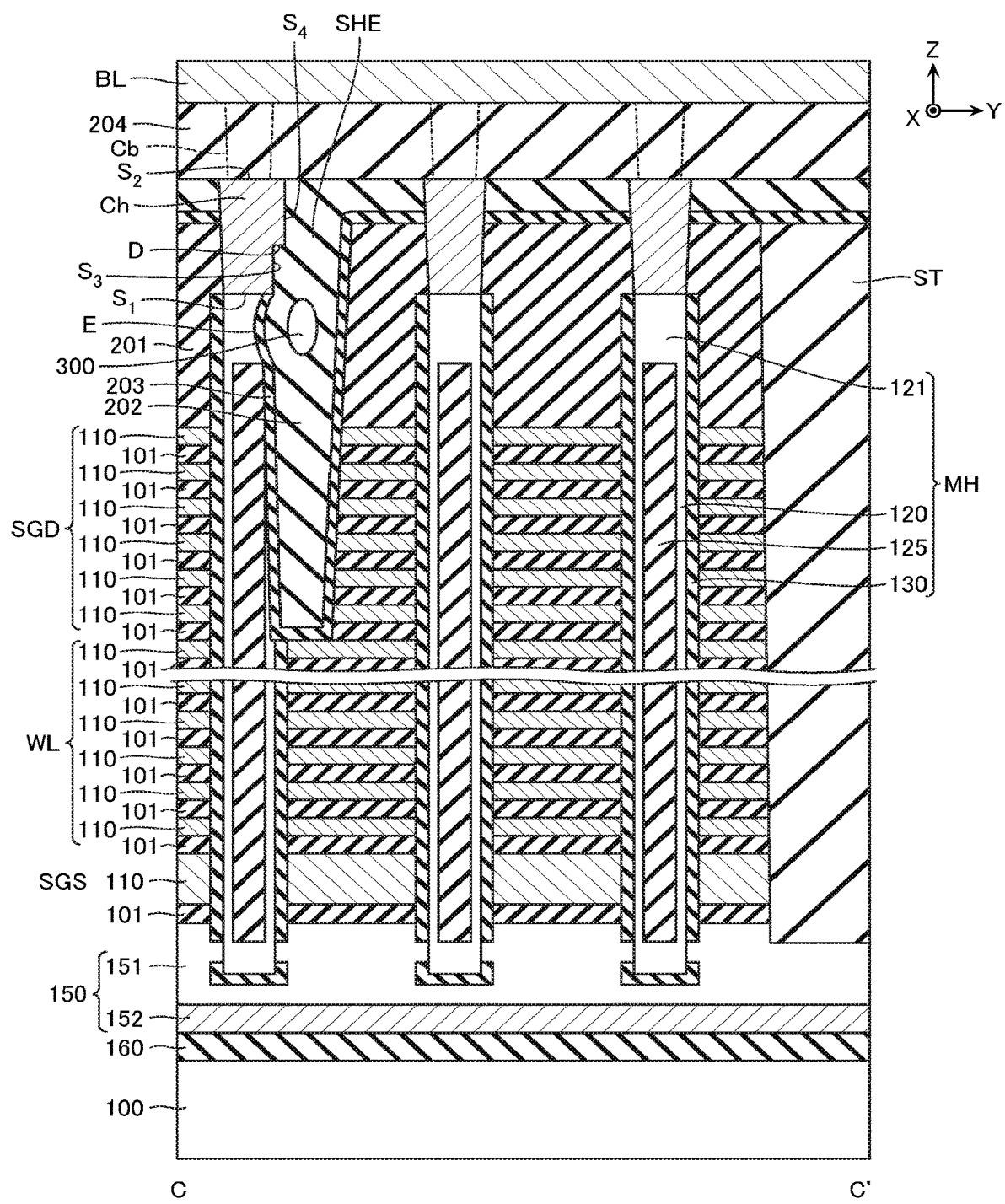
FIG. 6 is a schematic cross-sectional view of the structure of FIG. 5 along the line C-C' and viewed in an arrow direction.

FIG. 5 is a schematic plan view of the part indicated by A in FIG. 1. FIG. 6 is a schematic cross-sectional view of the structure illustrated in FIG. 5 taken along the line C-C' and viewed in an arrow direction.

In FIG. 5 and FIG. 6, the inter-block insulating layer ST extending in the X direction and the Z direction is disposed between the two memory blocks BLK adjacent in the Y direction. The inter-block insulating layer ST extends up to the lower wiring layer 150 in the Z direction and separates between the memory blocks BLK in the Y direction. Inside the inter-block insulating layer ST, a conductive film (not illustrated) may be internally formed while leaving insulating films on its side surface sides, so as to allow the conductive film to be connected to the lower wiring layer 150 to function as the contact for the lower wiring layer 150.

The memory block BLK includes the plurality of memory structures MH, the plurality of conductive layers 110, the plurality of insulating layers 101, and the plurality of bit lines BL in the region R1. The plurality of memory structures MH extend in the Z direction and are arranged in a staggered pattern in the XY directions. The plurality of conductive layers 110 are arranged in the Z direction and cover the outer peripheral surfaces of the plurality of memory structures MH on the X-Y cross-sectional surface. The plurality of insulating layers 101 are arranged between the plurality of conductive layers 110. The plurality of bit lines BL are electrically connected to the upper ends of the memory structures MH via the contacts Ch and Cb.

The memory block BLK includes contact regions Rcc in the region R2. The contact regions Rcc are disposed on end portions of the conductive layers 110 formed in a staircase pattern. In the contact region Rcc, a contact CC and supporting structures HR are arranged.

As illustrated in FIG. 5, the memory block BLK includes the plurality of string units SU in the Y direction. The insulating portion SHE extending in the X direction and the Z direction is disposed between the two string units SU adjacent in the Y direction. As illustrated in FIG. 6, among the plurality of conductive layers 110, the insulating portion SHE separates only the conductive layers 110 corresponding to the drain side select gate lines SGD in the Y direction.

In this embodiment, as illustrated in FIG. 5, rows of the memory structures MH arrayed in the X direction are aligned in four rows in the Y direction to form one string unit SU. Then, three or more string units SU are arranged in the Y direction to configure one memory block BLK. That is, two or more insulating portions SHE are arranged in one memory block BLK. Each of the insulating portions SHE is continuously formed in the X direction. Therefore, as described later, when the conductive layer 110 that serves as the drain side select gate line SGD is formed by replacement with a sacrifice layer via an opening for forming the inter-block insulating layer ST, if the insulating portion SHE were previously formed, the sacrifice layer between the insulating portions SHE could not be replaced. In view of this, the insulating portions SHE are formed after the memory structures MH and the conductive layers 110 are formed.

That is, after a first insulating layer 201 covers above the memory structures MH and the conductive layer 110, the insulating portion SHE is formed to penetrate from the first insulating layer 201 through the conductive layers 110 corresponding to the drain side select gate lines SGD. As illustrated in FIG. 5, the insulating portion SHE thus configured is formed between two rows of the memory structures MH, which are adjacent in the Y direction and arrayed in the X direction, such that the memory structures MH are partially cut out. In other words, as illustrated in FIG. 6, the insulating portion SHE is formed to contact a part of the memory structures MH (a portion corresponding to the drain-side select transistors STD). While the memory structures MH have portions in contact with the insulating portion SHE, and the portions are formed not to have a perfectly cylindrical shape, the memory structures MH function as the memory string MS.

As illustrated in FIG. 6, the insulating portion SHE is in contact with side surfaces of the contacts Ch above the memory structures MH. Upper end side surfaces of the memory structures MH and side surfaces of the contacts Ch that are not in contact with the insulating portion SHE are covered with the first insulating layer 201. The first insulating layer 201 contains, for example, silicon oxide, such as dTEOS (Tetraethyl ortho-silicate (TEOS) formed by plasma Chemical Vapor Deposition (CVD)). The insulating portion SHE includes a second insulating layer 202 and a third insulating layer 203. The second insulating layer 202 includes an insulating material different from that of the first insulating layer 201. The third insulating layer 203 covers an outside of this second insulating layer 202. The second insulating layer 202 contains, for example, silicon nitride (SiN). The third insulating layer 203 contains, for example, silicon oxide ($SiO_2$). The second insulating layer 202 is in contact with the contacts Ch, and the third insulating layer 203 is in contact with the memory structures MH. The semiconductor layer 121 has a portion in contact with the insulating portion SHE, and the portion has a depressed portion E. This depressed portion E widens the portion, faced to the semiconductor layer 121, of the insulating portion SHE, and this becomes a factor for generation of a seam 300 in this portion.

The contact Ch has a first end $S_1$ in contact with the semiconductor layer 121 and a second end $S_2$ positioned on a side opposite to this first end $S_1$ in the Z direction. The contact Ch has a step D on the side surface in contact with the insulating portion SHE. The step D includes a side surface $S_3$ on the first end $S_1$ side shifted to an inside in the Y direction with respect to a side surface $S_4$ on the second end $S_2$ side.

The insulating layers (the second insulating layer 202 and the third insulating layer 203), which form the insulating portion SHE, are formed on the first insulating layer 201, through which the insulating portion SHE penetrates, and extend in the X direction and the Y direction. An insulating layer 204 is formed above the second and third insulating layers 202 and 203 that thus cover above the first insulating layer 201. The bit lines BL are formed on the insulating layer 204. The contact Ch has a portion that does not contact the insulating portion SHE, and the portion is formed to penetrate the second and third insulating layers 202 and 203, which cover above the first insulating layer 201 on the second end $S_2$ side. The insulating layer 204 is provided with the contacts Cb that connect the contacts Ch to the bit lines BL.

[Manufacturing Method]

Next, the method for manufacturing the semiconductor memory device according to the embodiment is described with reference to FIG. 7 to FIG. 21B. FIG. 7 to FIG. 21B illustrate cross-sectional surfaces corresponding to the C-C' line in FIG. 5.

Figure 7:
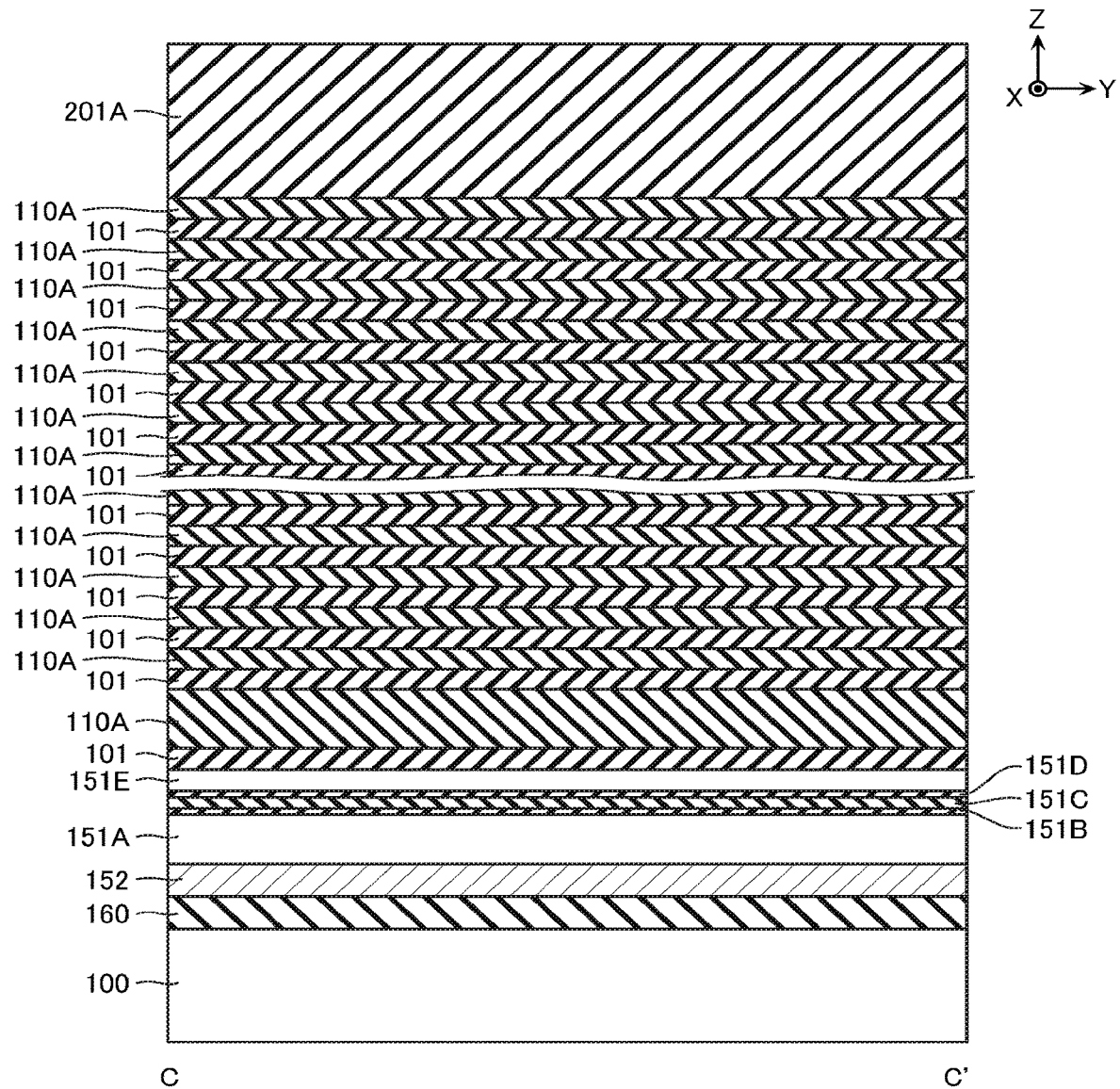
FIG. 7 is a schematic cross-sectional view illustrating a method for manufacturing the semiconductor memory device.

As illustrated in FIG. 7, the insulating layer 160, the conductive layer 152, a semiconductor layer 151A, an insulating layer 151B, a sacrifice layer 151C, an insulating layer 151D, and a semiconductor layer 151E are formed on the substrate 100. Above these layers, the plurality of insulating layers 101 and sacrifice layers 110A are alternately formed. Further, above these layers, an insulating layer 201A is formed.

The substrate 100 is, for example, a substrate on which the transistors Tr of the circuit layer CL as illustrated in FIG. 3 and the like are formed, or a semiconductor substrate of Si and the like. The insulating layer 160 contains, for example, silicon oxide. The conductive layer 152 contains, for example, tungsten silicide (WSi). The semiconductor layer 151A and the semiconductor layer 151E contain, for example, polysilicon (Si) to which phosphorus (P) is doped. The insulating layer 151B, the insulating layer 151D, and the insulating layer 101 contain, for example, silicon oxide. The sacrifice layer 151C and the sacrifice layer 110A contain, for example, silicon nitride (SiN). The insulating layer 201A contains, for example, silicon oxide, such as dTEOS. This process is performed, for example, by a method, such as CVD.

Figure 8:
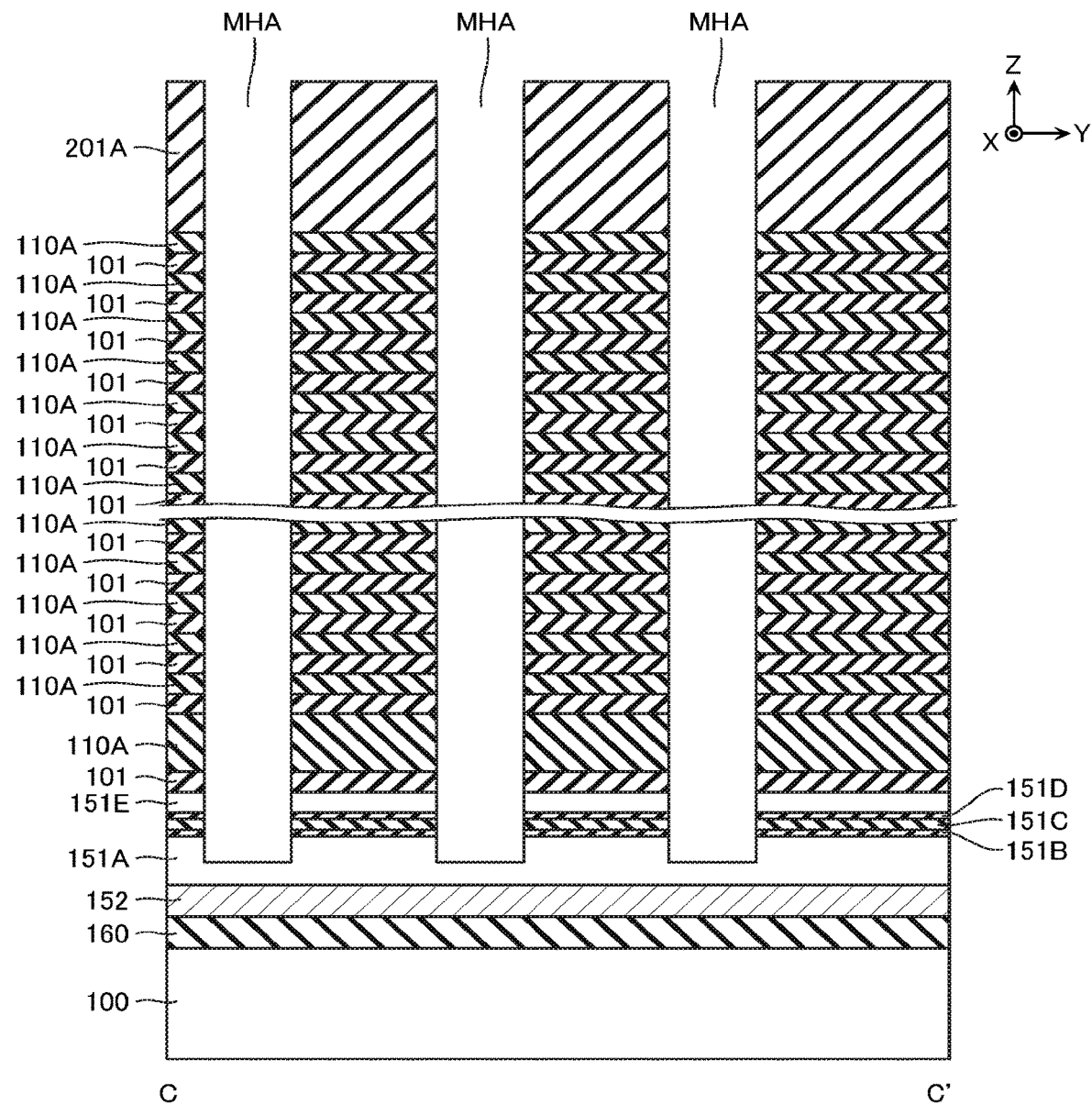
FIG. 8 is a schematic cross-sectional view illustrating the manufacturing method.

Subsequently, as illustrated in FIG. 8, openings MHA are formed in a stacked structure. The opening MHA extends in the Z direction and penetrates the insulating layer 201A, the sacrifice layers 110A, the insulating layers 101, the semiconductor layer 151E, the insulating layer 151D, the sacrifice layer 151C, and the insulating layer 151B to expose the semiconductor layer 151A. This process is performed by, for example, forming an insulating layer having openings at portions corresponding to the openings MHA on an upper surface of the stacked structure illustrated in FIG. 7 and performing Reactive Ion Etching (RIE) or the like using the insulating layer as a mask.

Figure 9:
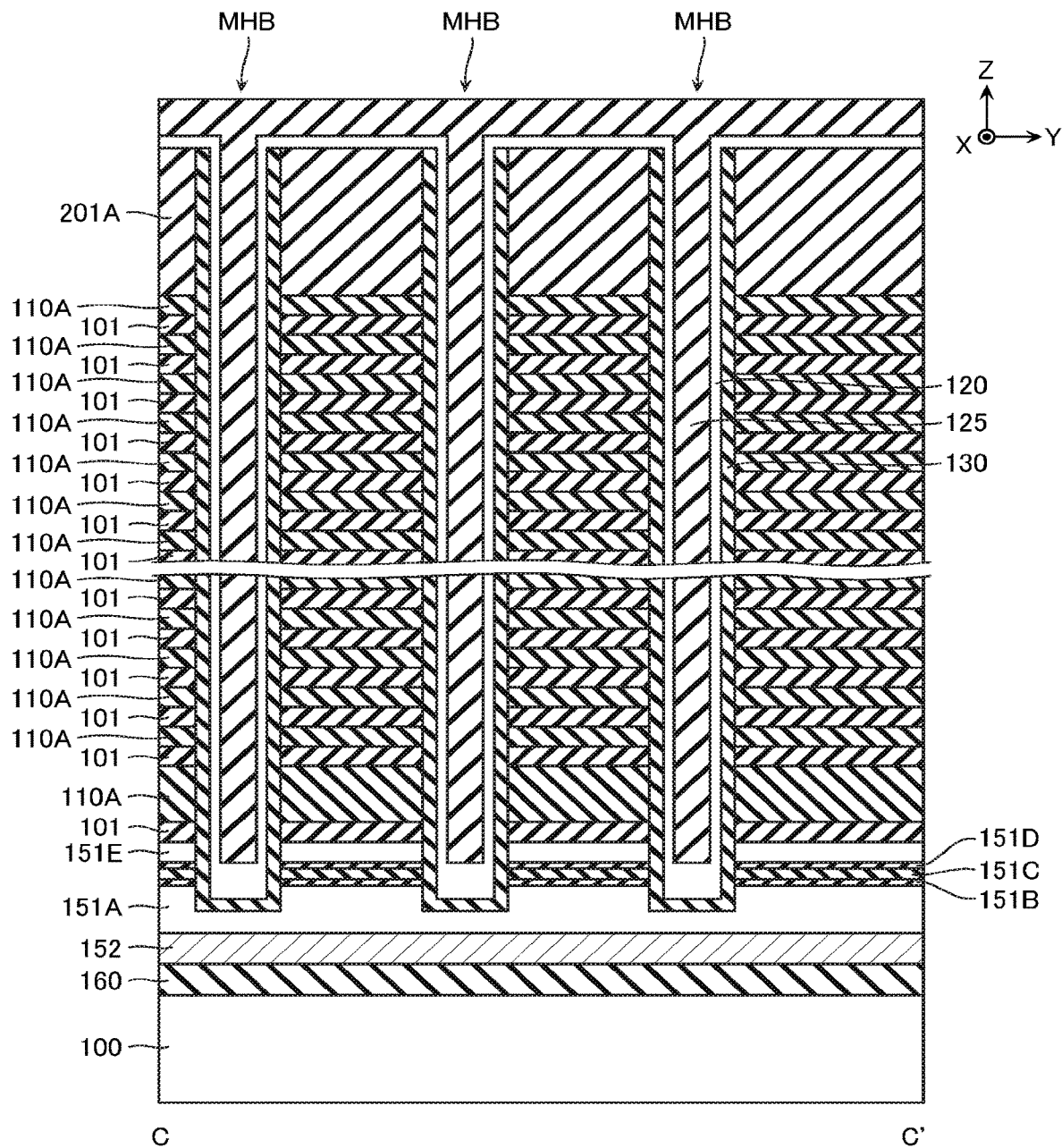
FIG. 9 is a schematic cross-sectional view illustrating the manufacturing method.

Subsequently, as illustrated in FIG. 9, the gate insulating layer 130, the semiconductor layer 120, and the core insulating layer 125 are sequentially formed on an inner peripheral surface of the opening MHA. This process is performed, for example, by a method, such as CVD. Thus, memory stacked structures MHB are formed. In this process, for example, a heat treatment or the like to modify a crystalline structure of the semiconductor layer 120 is performed.

Figure 10:
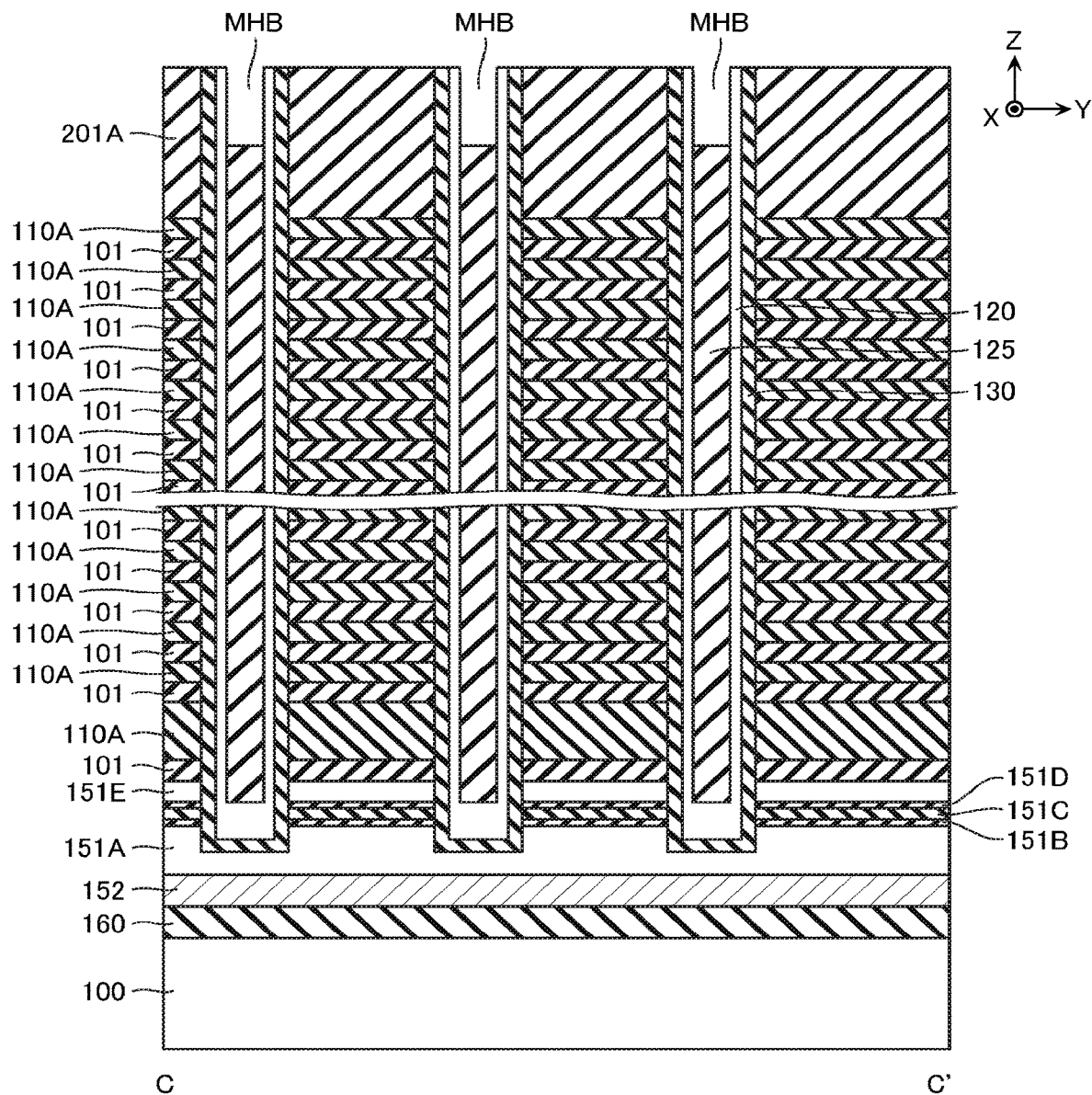
FIG. 10 is a schematic cross-sectional view illustrating the manufacturing method.

Subsequently, as illustrated in FIG. 10, the core insulating layer 125, the semiconductor layer 120, and the gate insulating layer 130, which are included in the memory stacked structure MHB, are partially removed to expose the insulating layer 201A positioned at the uppermost layer. An etchback is performed on an upper end of the core insulating layer 125 of the memory stacked structure MHB. This process is performed, for example, by a method, such as Chemical Mechanical Polishing (CMP) and RIE.

Figure 11:
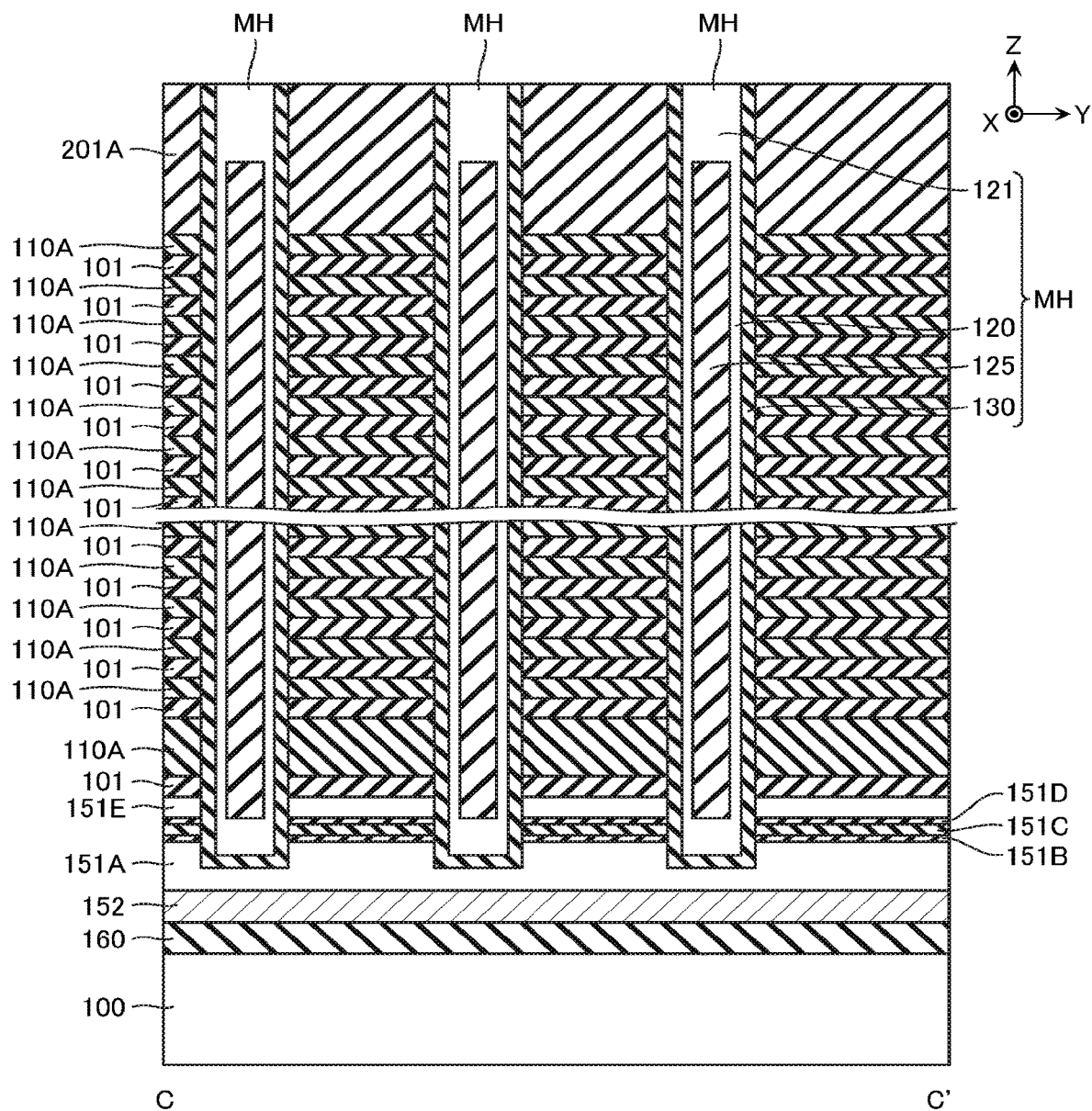
FIG. 11 is a schematic cross-sectional view illustrating the manufacturing method.

Subsequently, as illustrated in FIG. 11, the semiconductor layer 121 is formed on an upper end of the memory stacked structure MHB. The semiconductor layer 121 is made of, for example, amorphous silicon to which N-type impurities, such as phosphorus (P), are doped. This process is performed, for example, by a method, such as CVD. Thus, the memory structure MH having a substantially columnar shape is formed.

Figure 12:
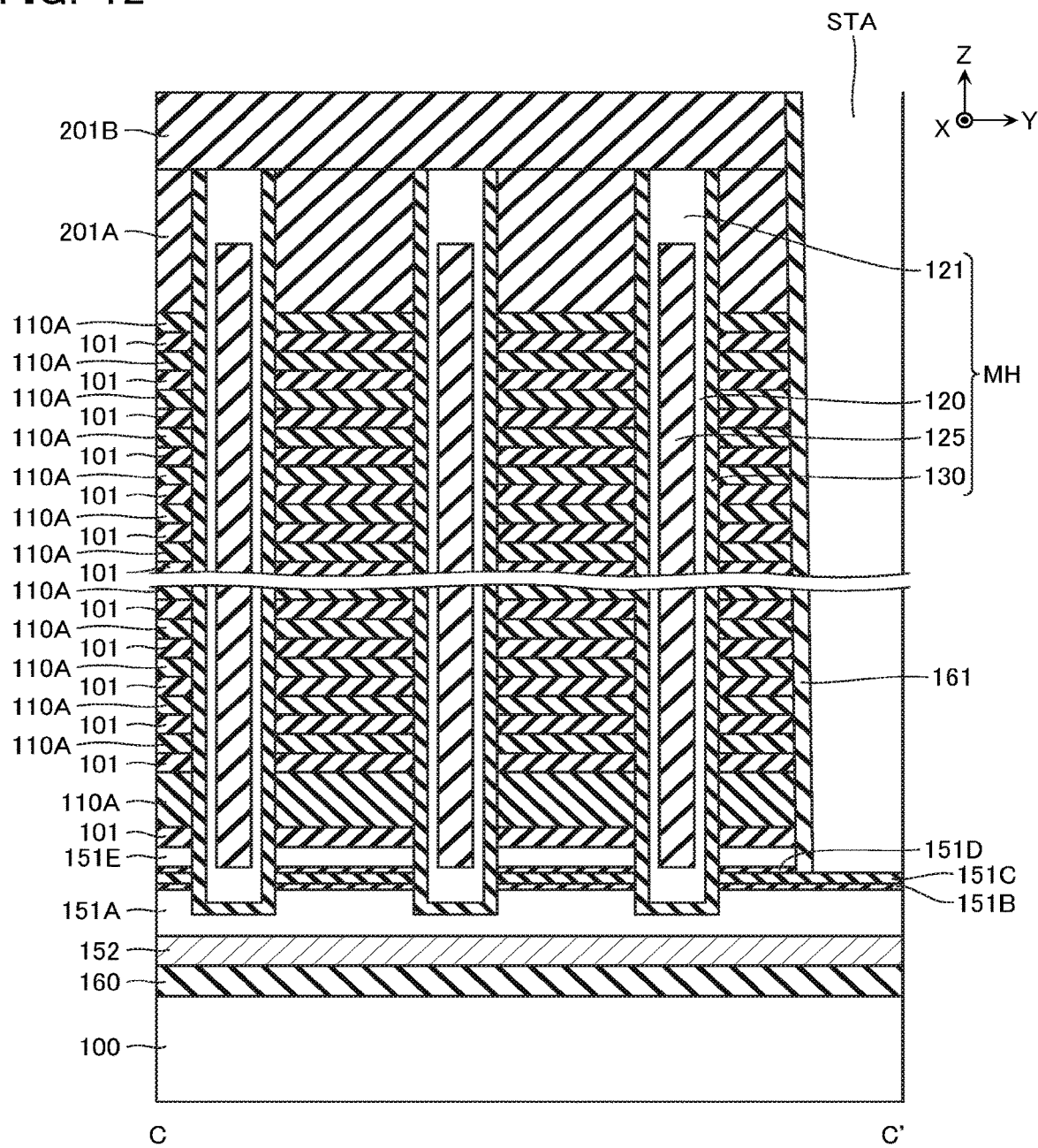
FIG. 12 is a schematic cross-sectional view illustrating the manufacturing method.

Subsequently, for example, as illustrated in FIG. 12, an insulating layer 201B of dTEOS and the like is formed on the upper surface of the structure illustrated in FIG. 11, and further, a mask (not illustrated) is formed to form an opening STA. The opening STA extends in the X direction and the Z direction and separates the insulating layers 201B and 201A, the plurality of sacrifice layers 110A, and the plurality of insulating layers 101 in the Y direction. The opening STA penetrates the semiconductor layer 151E and the insulating layer 151D to expose the sacrifice layer 151C on the bottom portion. This process is performed, for example, by a method, such as RIE. Further, an insulating layer 161 of silicon oxide (SiO$_2$) and the like, is formed on an inner wall surface and the bottom surface of the opening STA to cover a side surface of the stacked structure, and thereafter, the bottom surface of the opening STA is dug down inside the sacrifice layer 151C. This process is performed by a method, such as RIE.

Figure 13:
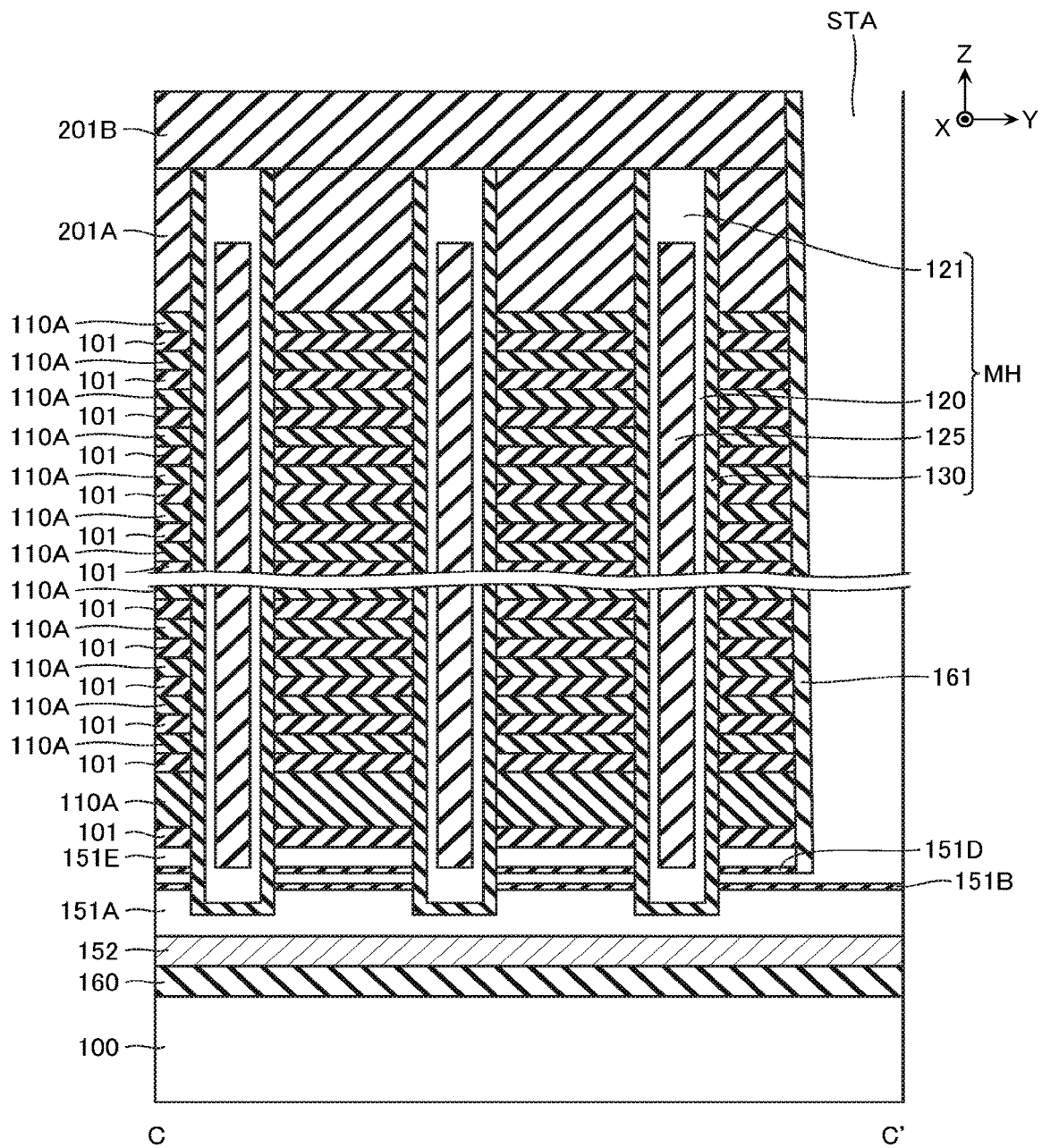
FIG. 13 is a schematic cross-sectional view illustrating the manufacturing method.

Subsequently, as illustrated in FIG. 13, the sacrifice layer 151C is removed via the opening STA to expose a part of a sidewall of the gate insulating layer 130 of the memory structure MH. This process is performed, for example, by a method, such as wet etching. In this process, the sacrifice layers 110A formed of the same type of material as that of the sacrifice layer 151C are protected by the insulating layer 161, and therefore are not simultaneously etched.

Figure 14:
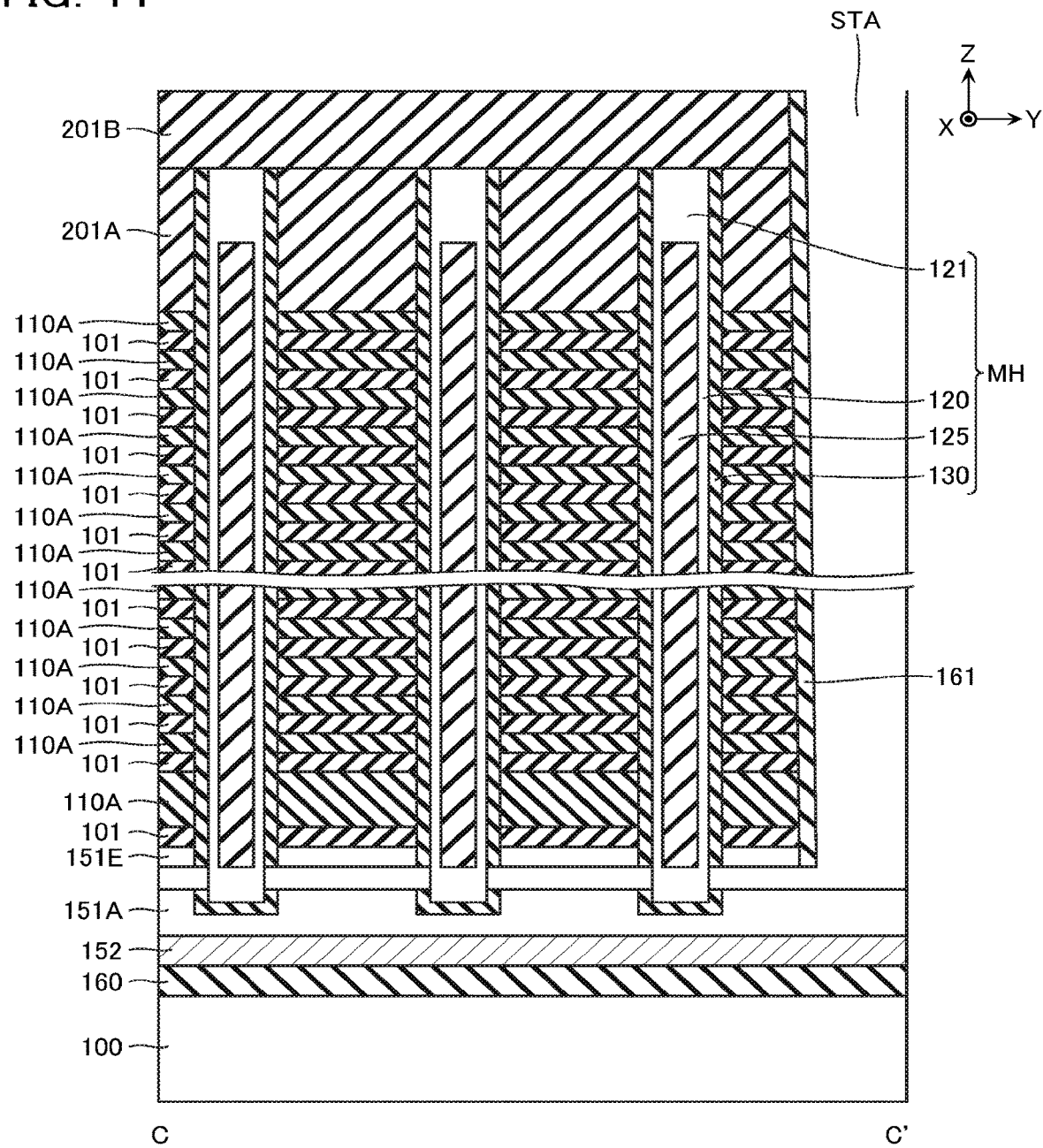
FIG. 14 is a schematic cross-sectional view illustrating the manufacturing method.

Subsequently, as illustrated in FIG. 14, a part of the gate insulating layer 130 is removed via the opening STA and the void where the sacrifice layer 151C had been disposed to expose a side surface of the semiconductor layer 120. In this process, the insulating layer 151B and the insulating layer 151D, which include the same type of material as that of the gate insulating layer 130, are also simultaneously removed. This process is performed, for example, by a method, such as chemical dry etching.

Figure 15:
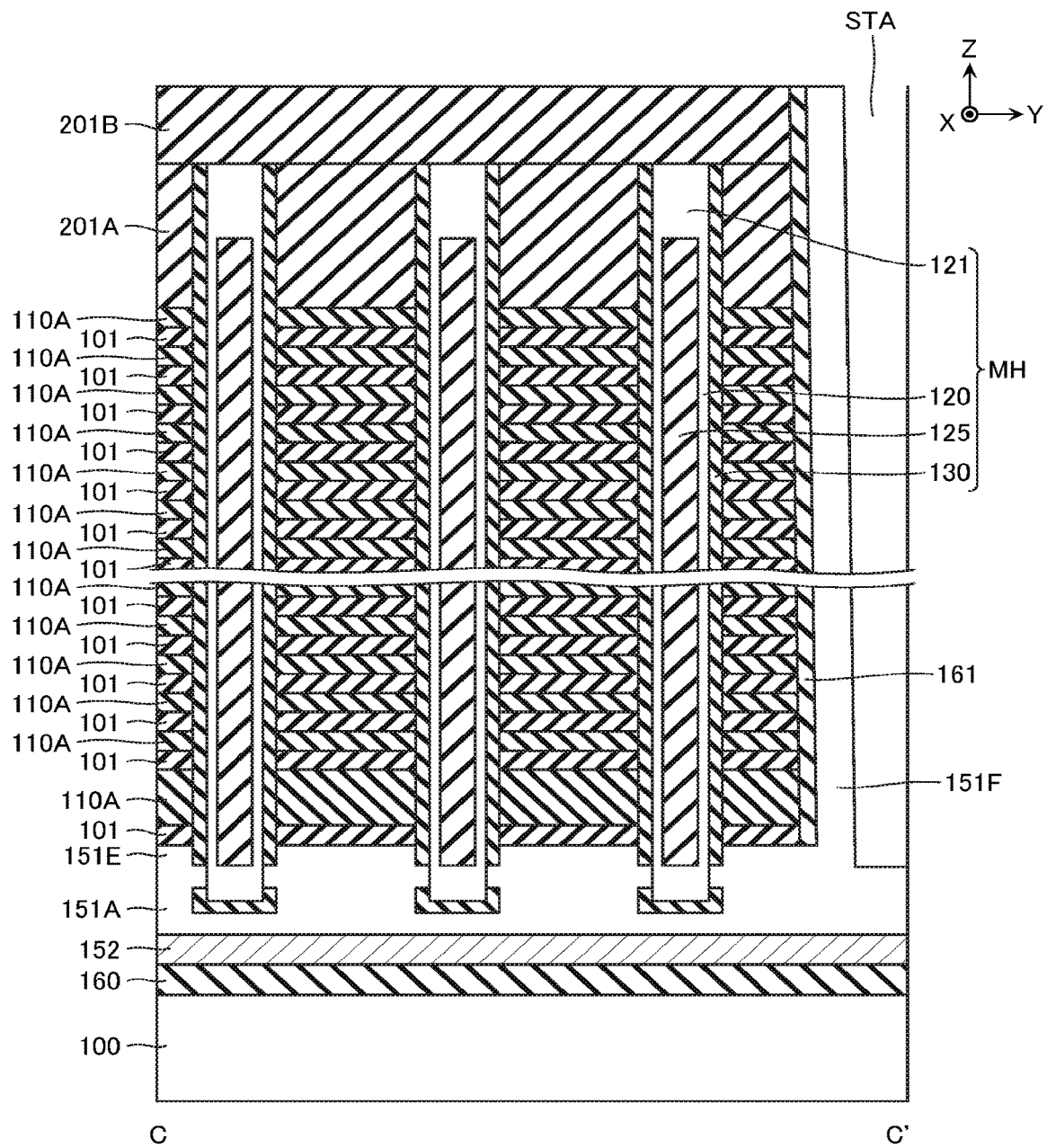
FIG. 15 is a schematic cross-sectional view illustrating the manufacturing method.

Subsequently, as illustrated in FIG. 15, a semiconductor layer 151F of polysilicon (Si) and the like is formed on the side surfaces of the semiconductor layers 120, an upper surface of the semiconductor layer 151A, a lower surface of the semiconductor layer 151E, and an inner wall of the opening STA. This process is performed, for example, by a method, such as epitaxial growth of the semiconductor.

Figure 16:
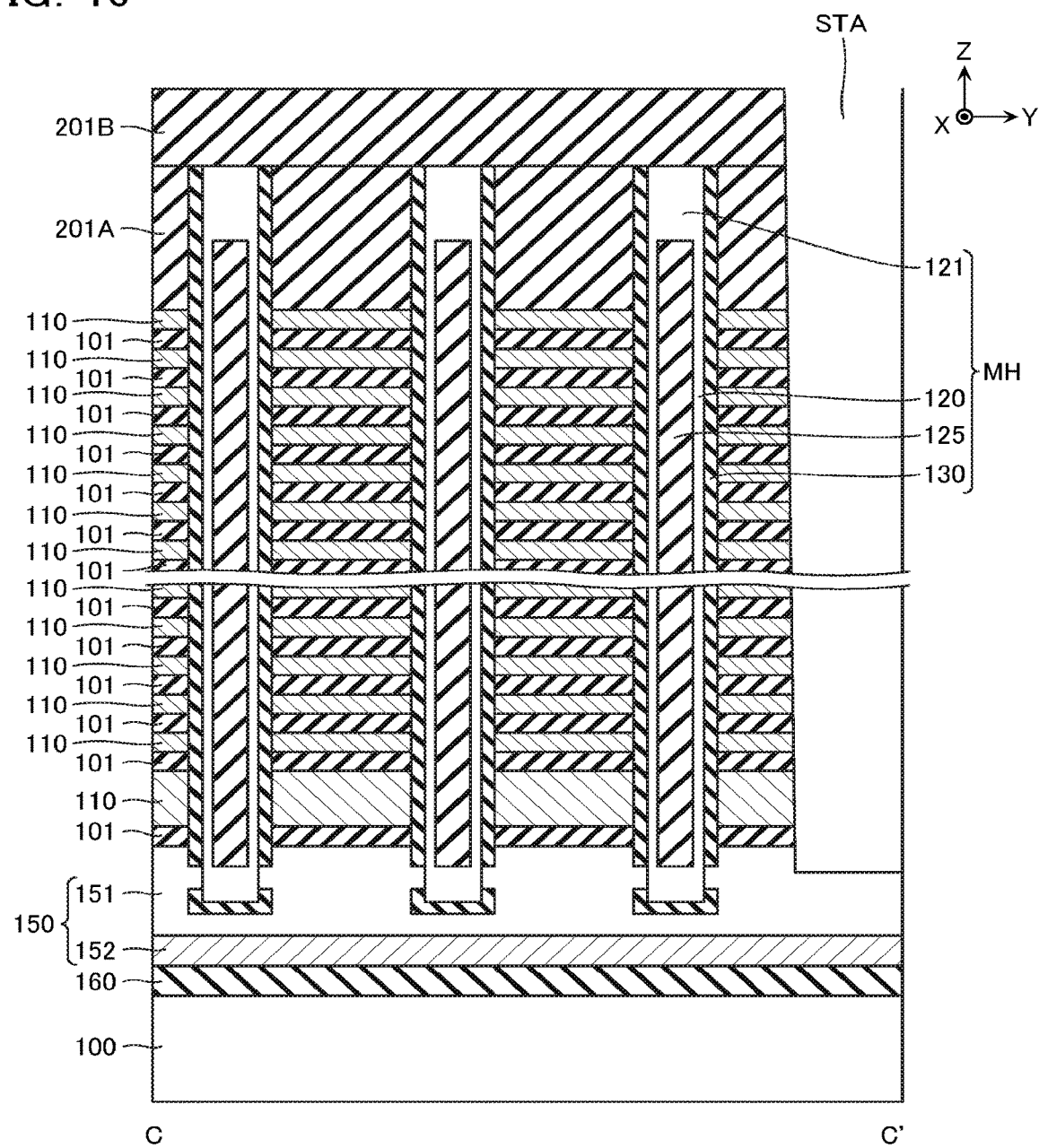
FIG. 16 is a schematic cross-sectional view illustrating the manufacturing method.

Subsequently, as illustrated in FIG. 16, the semiconductor layer 151F of the inner wall portion of the opening STA is removed. This process is performed, for example, by a method, such as wet etching. Subsequently, after the insulating layer 161, which covers a sidewall of the opening STA, is removed, the plurality of sacrifice layers 110A are removed via the opening STA, and the plurality of conductive layers 110 are formed in the portions where the sacrifice layers 110A had existed. The process of removing the insulating layer 161 and the sacrifice layers 110A is performed, for example, by a method, such as wet etching. The conductive layers 110 are formed, for example, by a method, such as CVD.

Figure 17:
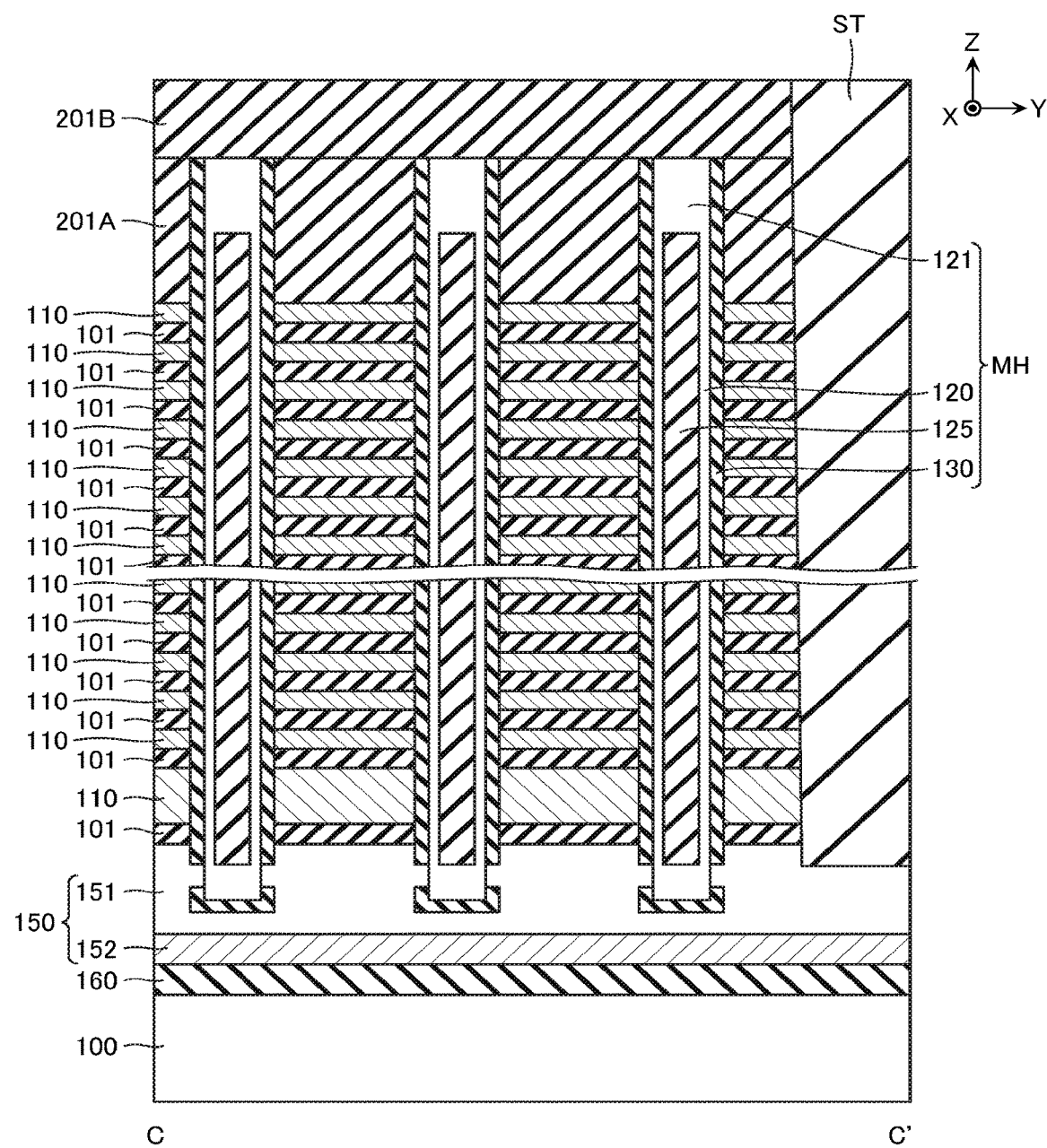
FIG. 17 is a schematic cross-sectional view illustrating the manufacturing method.

Subsequently, as illustrated in FIG. 17, the inter-block insulating layer ST is formed in the opening STA. This process is performed, for example, by a method, such as CVD.

Figure 18:
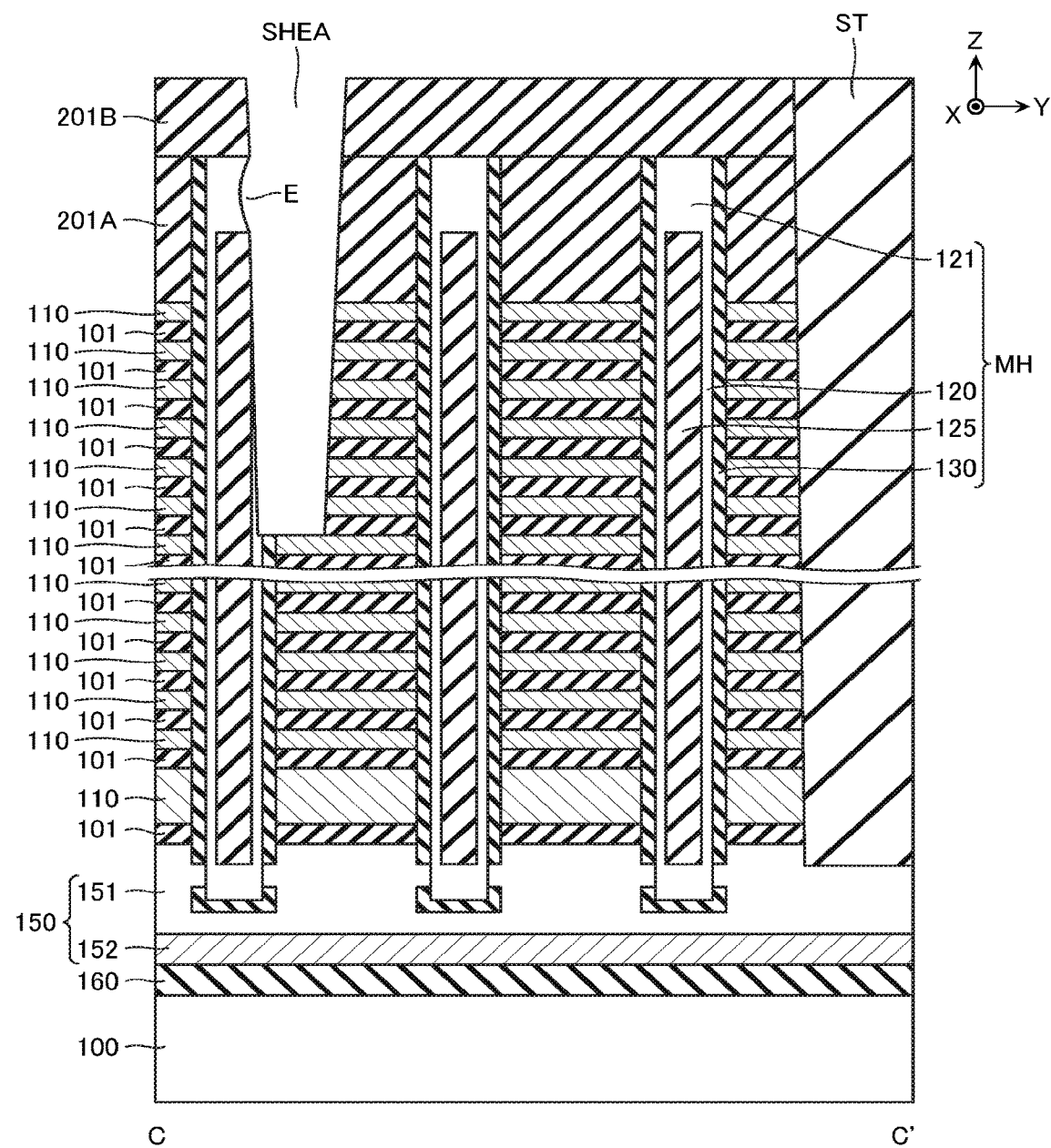
FIG. 18 is a schematic cross-sectional view illustrating the manufacturing method.

Subsequently, as illustrated in FIG. 18, an opening SHEA is formed in order to form the insulating portion SHE, which separates the memory structures MH for each of the string units SU. The opening SHEA is formed such that a part (upper end side) of the memory structure MH is shaved off. The opening SHEA is formed such that only the conductive layers 110 that serve as the drain side select gate lines SGD are separated in the Y direction. This process is performed by a method, such as RIE.

As illustrated in FIG. 18, when the opening SHEA is formed, since the semiconductor layer 120 and the semiconductor layer 121 are more easily shaved than the core insulating layer 125, etching in the Y direction proceeds in the portion of the semiconductor layer 121 in the process of RIE, and the depressed portion E is formed in some cases.

Figure 19:
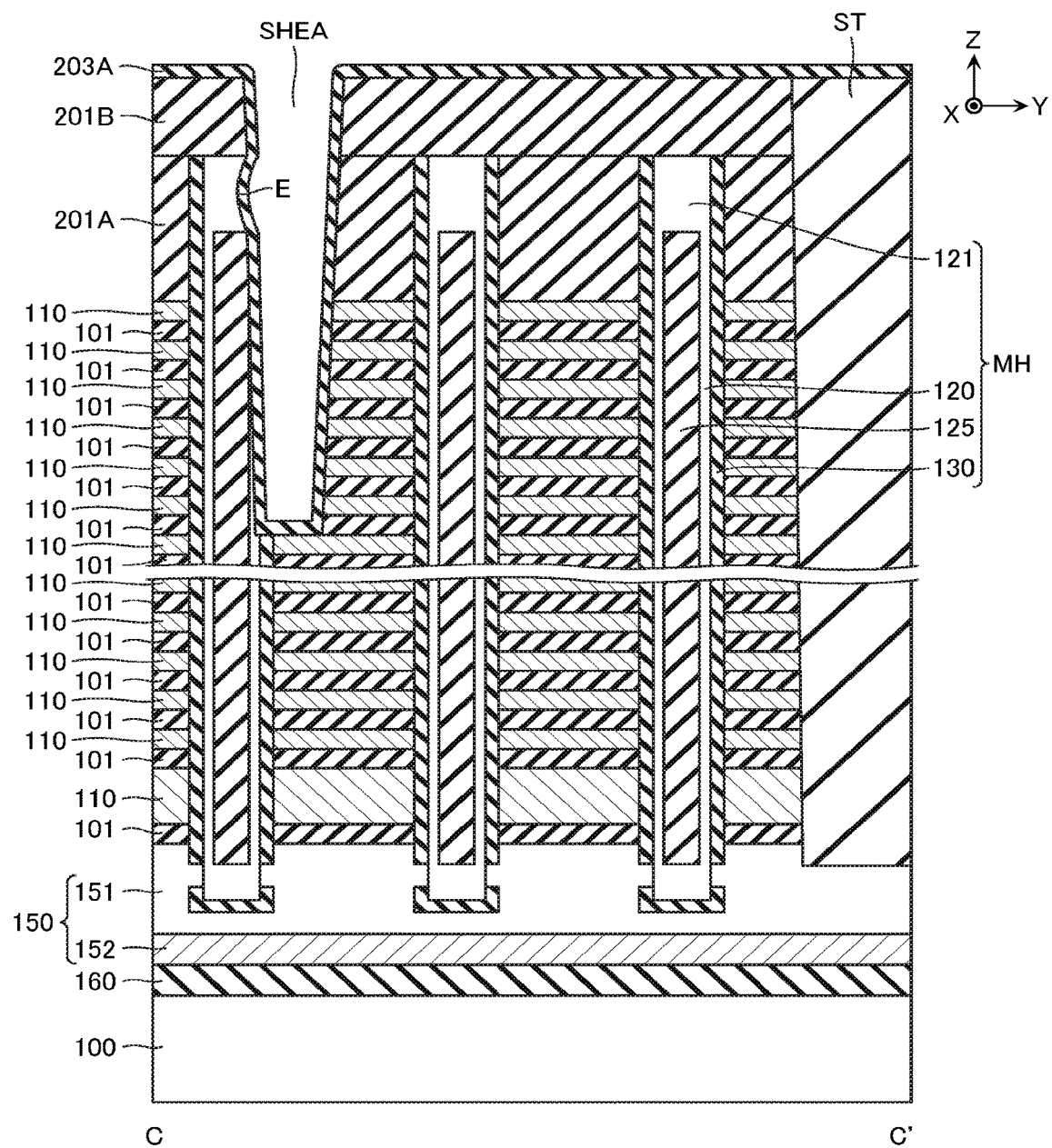
FIG. 19 is a schematic cross-sectional view illustrating the manufacturing method.

Subsequently, as illustrated in FIG. 19, for example, an insulating layer 203A of silicon oxide (SiO$_2$) and the like is formed on a side surface and the bottom surface of the opening SHEA. This process is performed, for example, by a method, such as CVD.

Figure 20:
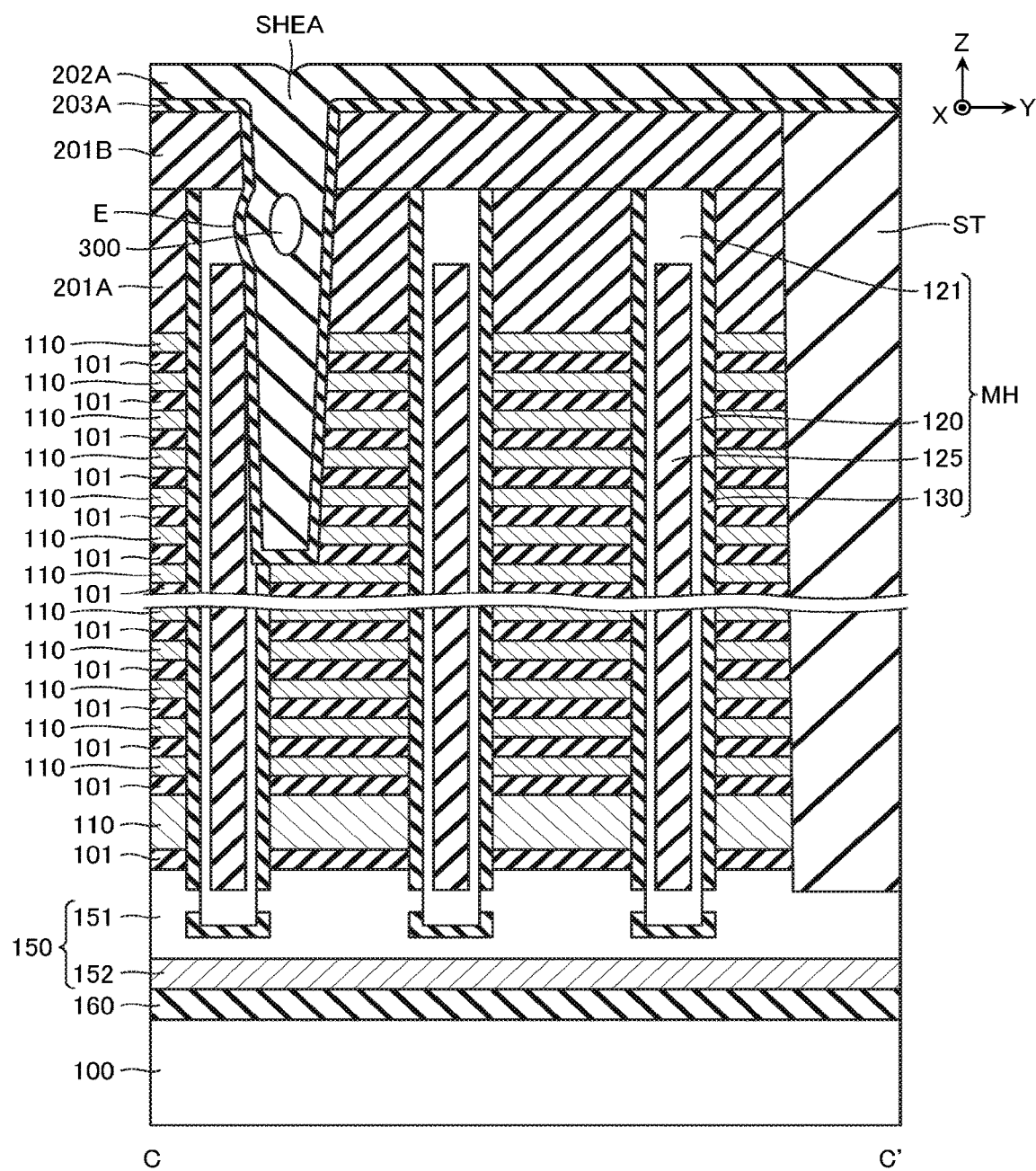
FIG. 20 is a schematic cross-sectional view illustrating the manufacturing method.

Subsequently, as illustrated in FIG. 20, for example, an insulating layer 202A of silicon nitride (SiN) and the like is formed inside the insulating layer 203A of the opening SHEA. This process is performed, for example, by a method, such as CVD. Thus, the insulating portion SHE is formed. As illustrated in FIG. 20, when the depressed portion E is formed on a side surface of the semiconductor layer 121, there is a possibility that the seam 300 is generated at the position corresponding to the position in the Z direction where the depressed portion E is formed when the insulating layer 202A is embedded into the opening SHEA.

Figure 21A:
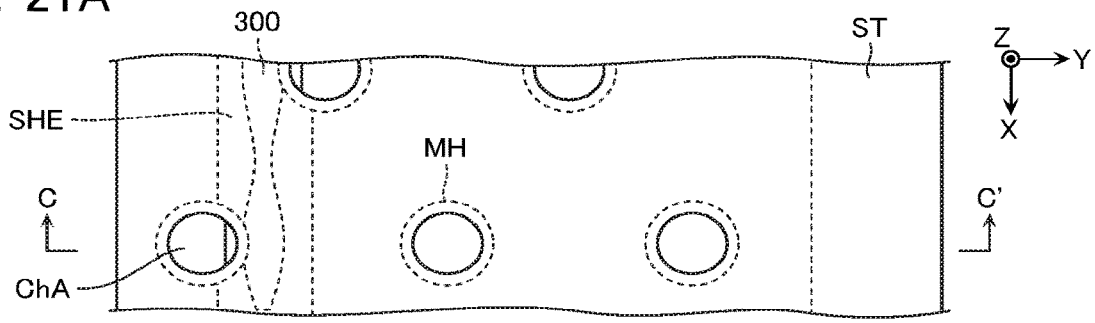
FIG. 21A is a schematic view illustrating the manufacturing method.
Figure 21B:
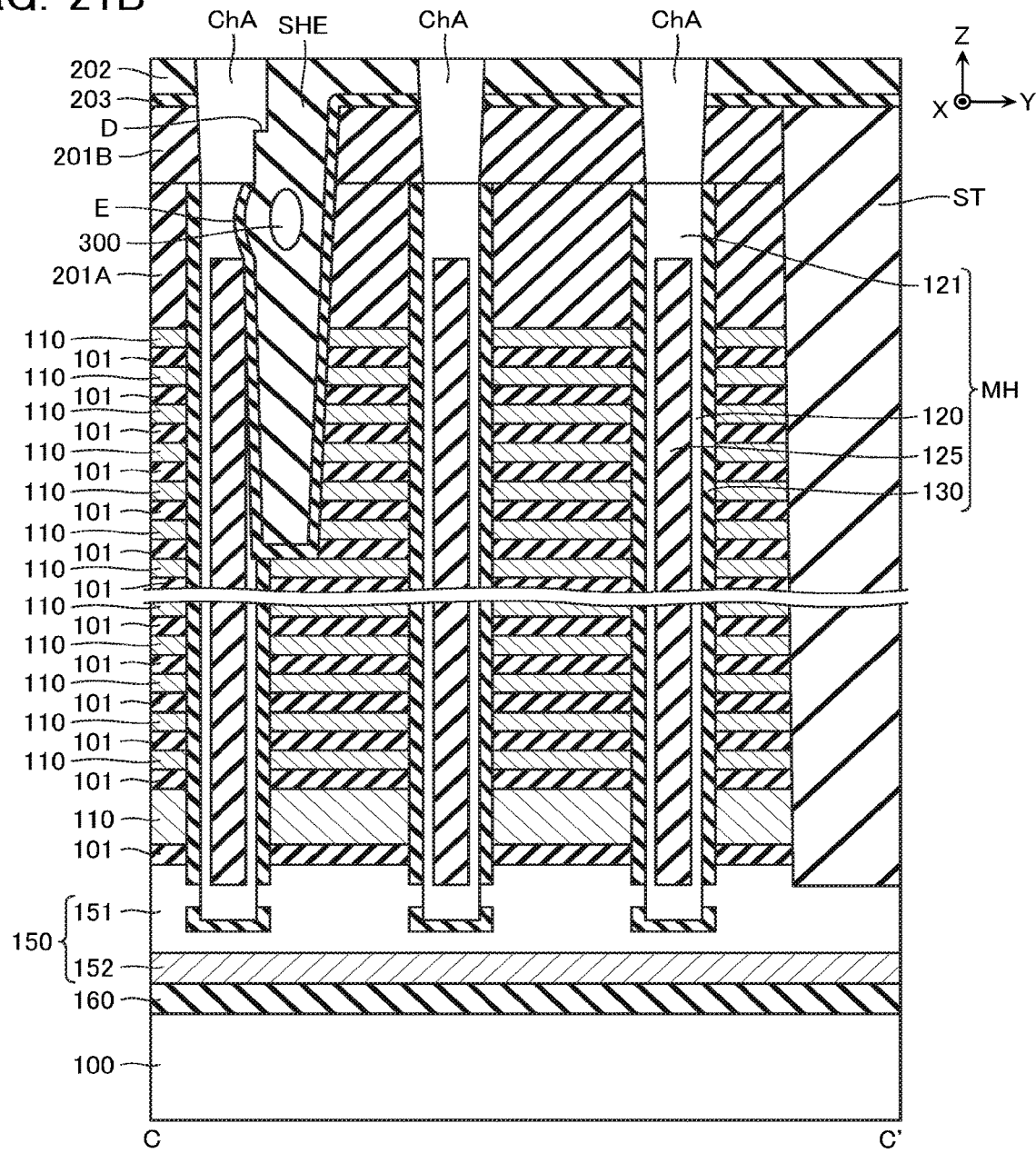
FIG. 21B is a schematic cross-sectional view illustrating the manufacturing method.

Subsequently, as illustrated in FIG. 21B, an upper portion of the insulating layer 202A is flattened by a method, such as CMP, a mask (not illustrated) is formed thereon, and columnar shaped openings ChA for forming the contacts Ch are formed on the memory structures MH. This process is performed by a method, such as RIE.

When the opening ChA for the contact Ch connected to the memory structure MH in contact with the insulating portion SHE is formed, the opening ChA is formed also on the boundary portion between the insulating portion SHE and the first insulating layer 201. An etching rate of the second insulating layer 202 that contains silicon nitride constituting the insulating portion SHE is lower than those of the first insulating layer 201, which contains silicon oxide, and the third insulating layer 203, which constitutes the insulating portion SHE. In view of this, as illustrated in FIG. 21B, for the opening ChA in contact with the insulating portion SHE, etchings of the first insulating layer 201 and the third insulating layer 203 precede an etching of the second insulating layer 202. As the result, the step D is formed to have a lower side shifted to the inside with respect to the upper side in the side surface in contact with the insulating portion SHE.

Then, the contacts Ch are formed in the thus formed openings ChA, the insulating layer 204 is formed thereon, and the contacts Cb electrically connected to the contacts Ch are formed in the insulating layer 204. Further, the configuration that has been described with reference to FIG. 6 is formed by disposing the respective bit lines BL on upper portions of the contacts Cb.

Effects of Embodiment

Next, effects of the embodiment are described with reference to a comparative example illustrated in FIG. 22 as well.

Figure 22:
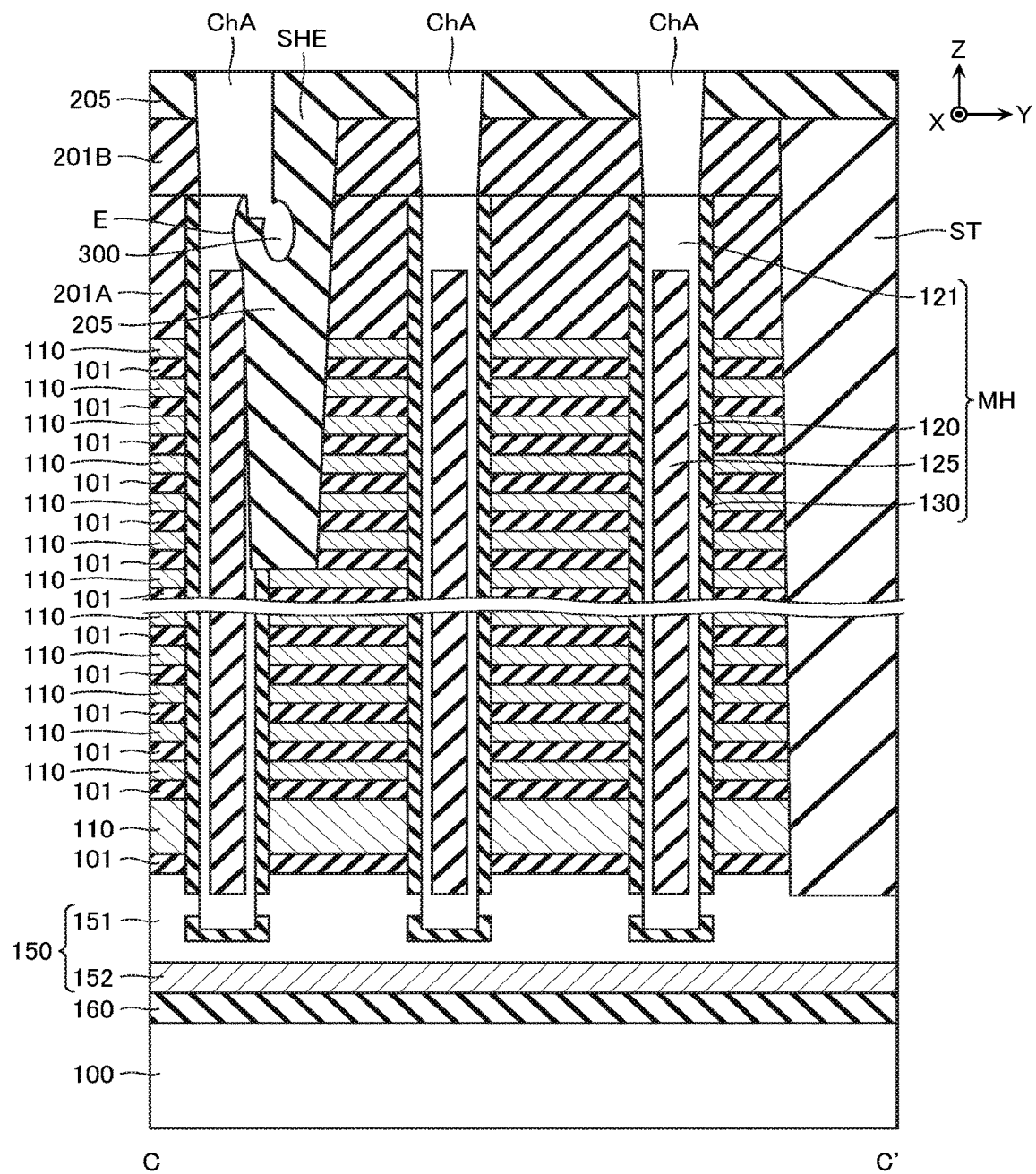
FIG. 22 is a schematic cross-sectional view illustrating a method for manufacturing a semiconductor memory device according to a comparative example.

As illustrated in FIG. 22, when the insulating portion SHE is formed with an insulating layer 205 of silicon oxide and the like similar to the first insulating layer 201, etching uniformly proceeds in the whole opening ChA while the opening ChA for forming the contact Ch in contact with the insulating portion SHE is formed. In view of this, there is a possibility that the etching further proceeds on the insulating layer 205 side, which causes a distal end of the opening ChA that has reached the semiconductor layer 121 to reach up to the seam 300. In this case, there is a possibility that the contact Ch penetrates into the seam 300 when the contact Ch as a conductive body is formed. As illustrated in FIG. 21A, since the seam 300 may extend in the X direction, there is a possibility that the plurality of contacts Ch disposed in the X direction are short-circuited when the conductive body enters this seam 300.

In this respect, in the semiconductor memory device according to the embodiment, as illustrated in FIG. 21A and FIG. 21B, when the opening ChA is formed, the etching of the side in contact with the insulating portion SHE is delayed. Therefore, the step D is formed on the side surface on the insulating portion SHE side of the opening ChA to avoid formation of a hole that reaches the seam 300. In view of this, a problem that the contacts Ch adjacent in the X direction are mutually short-circuited can be reliably avoided.

In this embodiment, since the third insulating layer 203 as an oxide film is formed in the portion in contact with the memory structure MH, electric characteristics similar to those of the insulating portion SHE filled with a conventional oxide film can be maintained. Since it suffices that the third insulating layer 203 and the second insulating layer 202 are sequentially formed, it is easy to control, and the manufacturing process is not made complicated.

Second Embodiment

Figure 23:
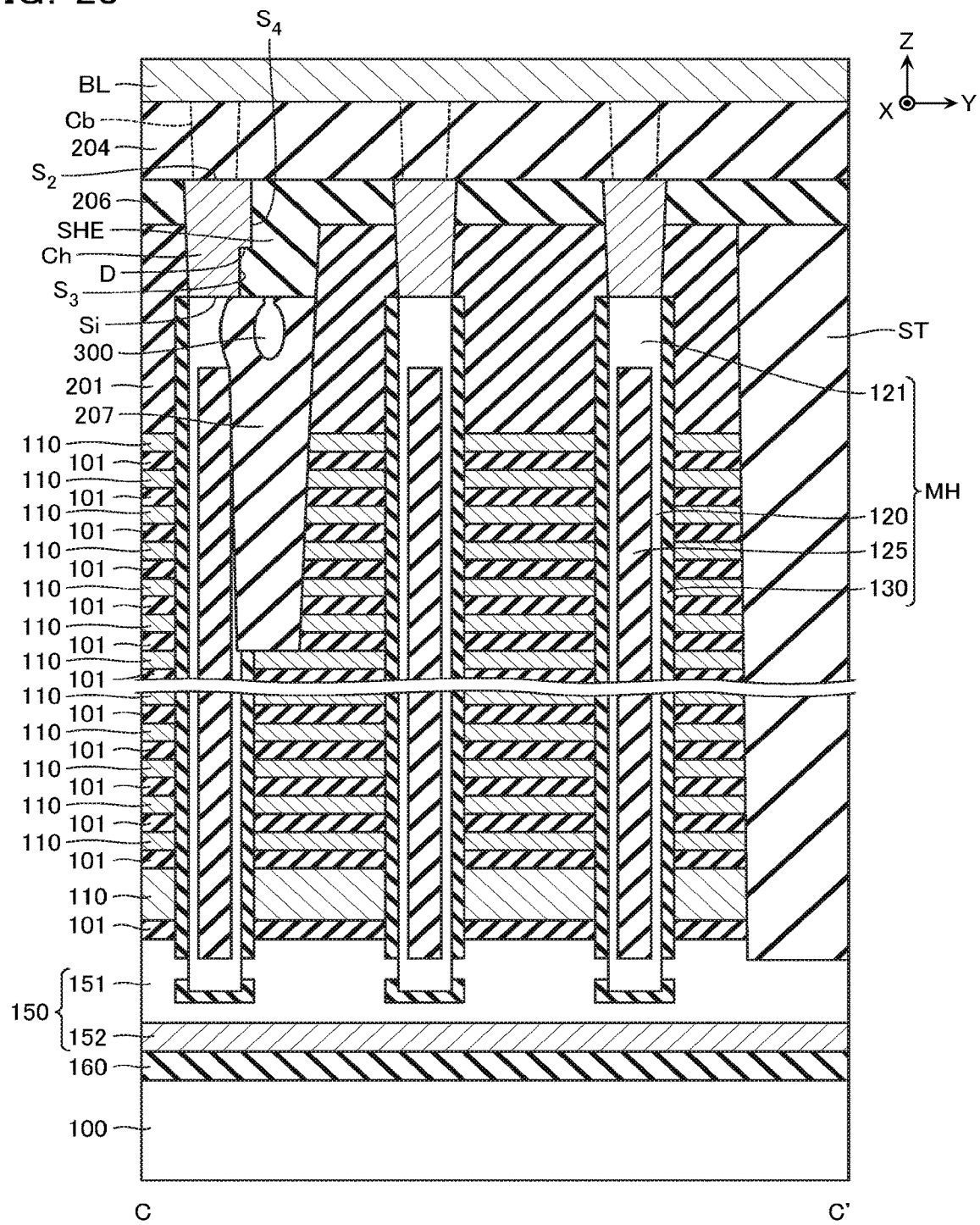
FIG. 23 is a schematic cross-sectional view of a semiconductor memory device according to a second embodiment.

FIG. 23 is a cross-sectional view of a semiconductor memory device according to a second embodiment and corresponds to a cross-sectional view taken along the C-C' line in FIG. 5 and viewed in the arrow direction.

In the second embodiment, the insulating portion SHE includes a second insulating layer 206 and a third insulating layer 207. The second insulating layer 206 is positioned above an upper surface of the semiconductor layer 121 in the Z direction. The third insulating layer 207 is positioned below the upper surface of the semiconductor layer 121 in the Z direction. The second insulating layer 206 contains, for example, silicon nitride (SiN). The third insulating layer 207 contains, for example, silicon oxide ($SiO_2$), such as Low Temperature Oxide (LTO). The second insulating layer 206 is in contact with the contact Ch, and the third insulating layer 207 is in contact with the memory structure MH. An etching rate of the second insulating layer 206 is lower than that of the first insulating layer 201.

Next, a method for manufacturing the semiconductor memory device according to the embodiment is described with reference to FIG. 24 to FIG. 28. FIG. 24 to FIG. 28 illustrate cross-sectional surfaces corresponding to the C-C' line in FIG. 5.

Figure 24:
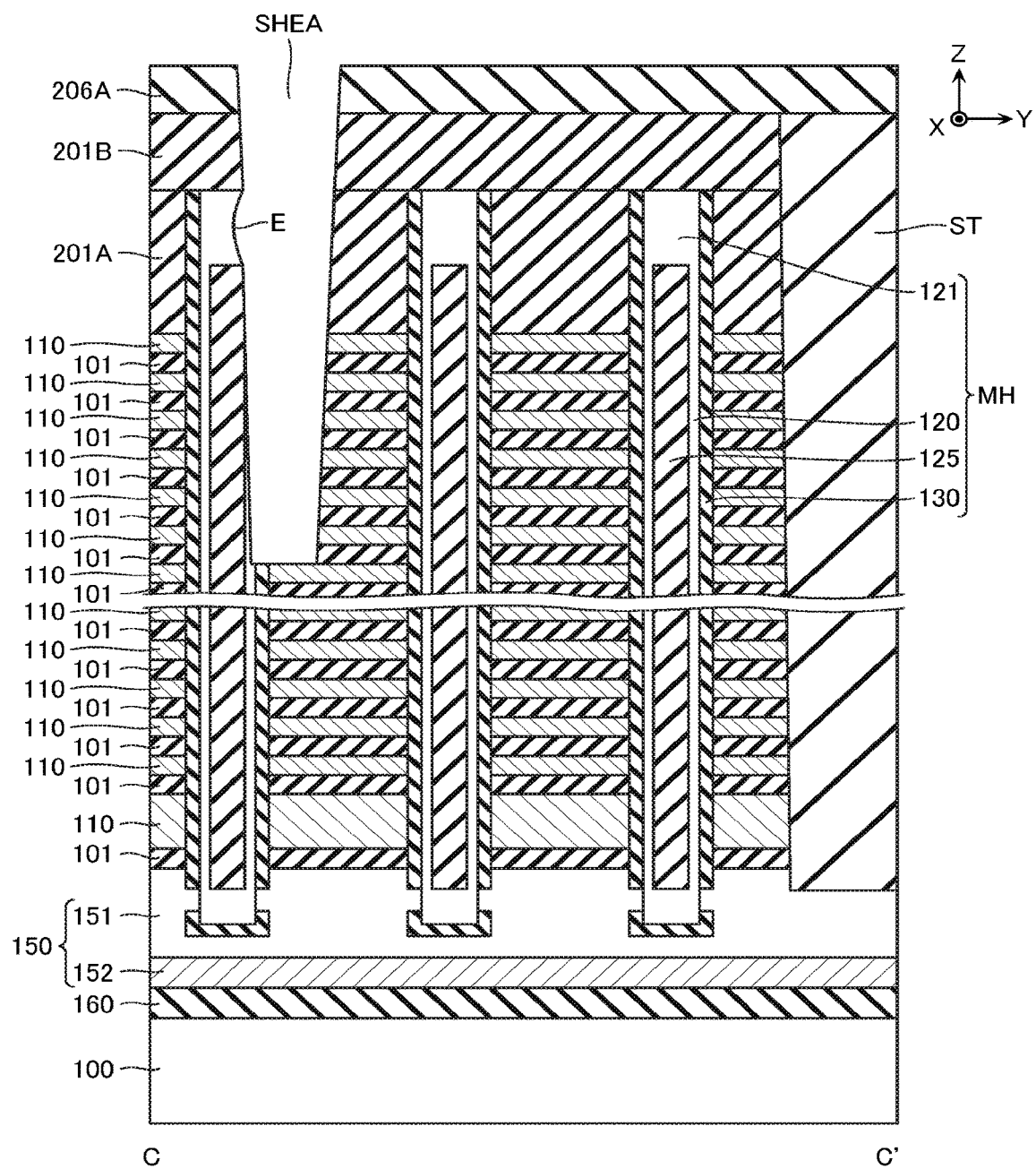
FIG. 24 is a schematic cross-sectional view illustrating a method for manufacturing the semiconductor memory device.

The manufacturing process of the embodiment up to the formation of the inter-block insulating layer ST illustrated in FIG. 17 is similar to that of the first embodiment. In this state, as illustrated in FIG. 24, for example, a mask by an insulating layer 206A of silicon nitride (SiN) and the like is formed, and the opening SHEA for forming the insulating portion SHE is formed. This process is performed by a method, such as RIE. In this case as well, the depressed portion E is formed on a sidewall of the semiconductor layer 121 in some cases.

Figure 25:
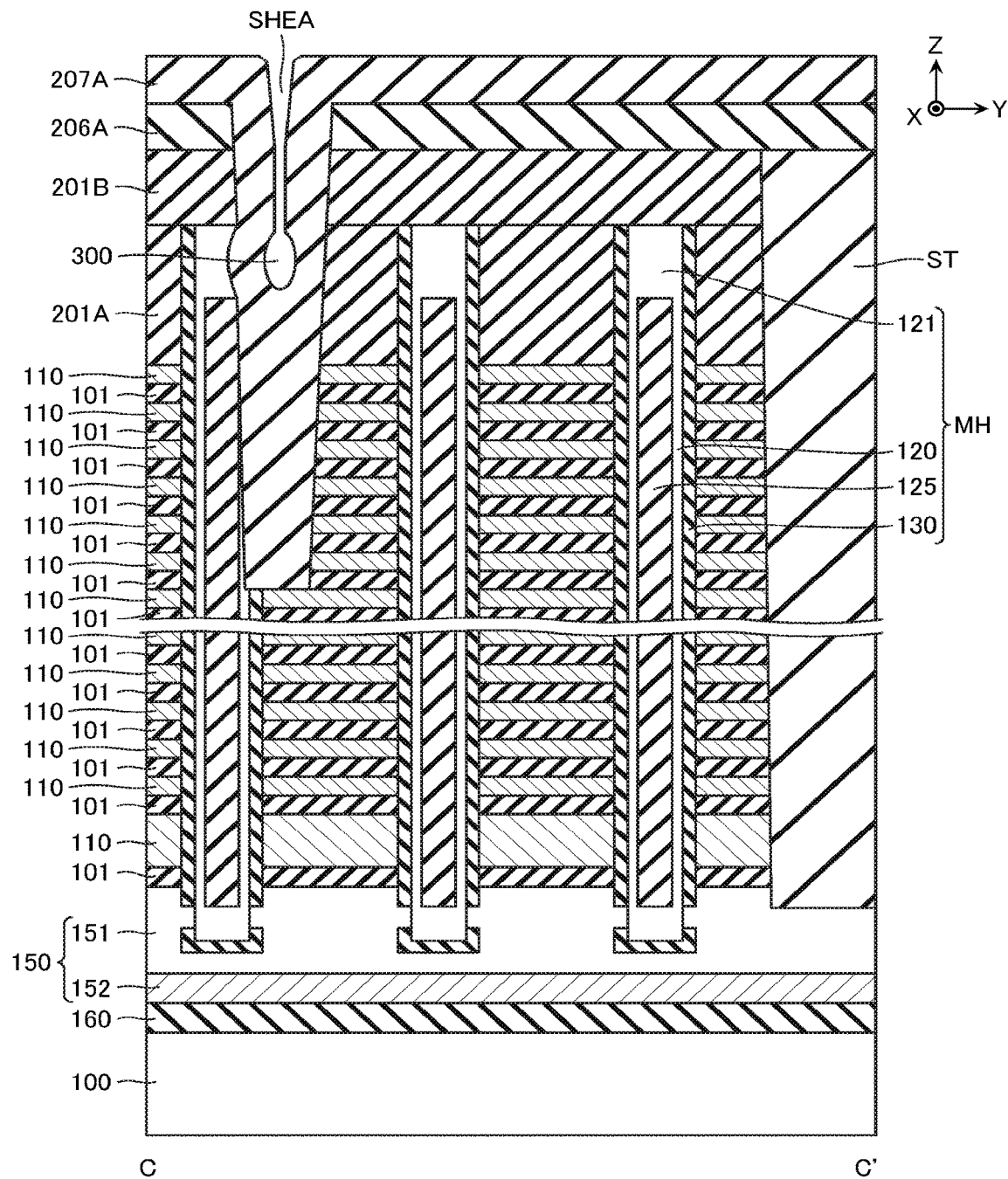
FIG. 25 is a schematic cross-sectional view illustrating the manufacturing method.

Subsequently, as illustrated in FIG. 25, for example, an insulating layer 207A of LTO and the like is embedded inside the opening SHEA. This process is performed by a method, such as CVD. At this time, the insulating layer 207A has a portion opposed to the semiconductor layer 121, and the seam 300 is generated in the portion in some cases.

Figure 26:
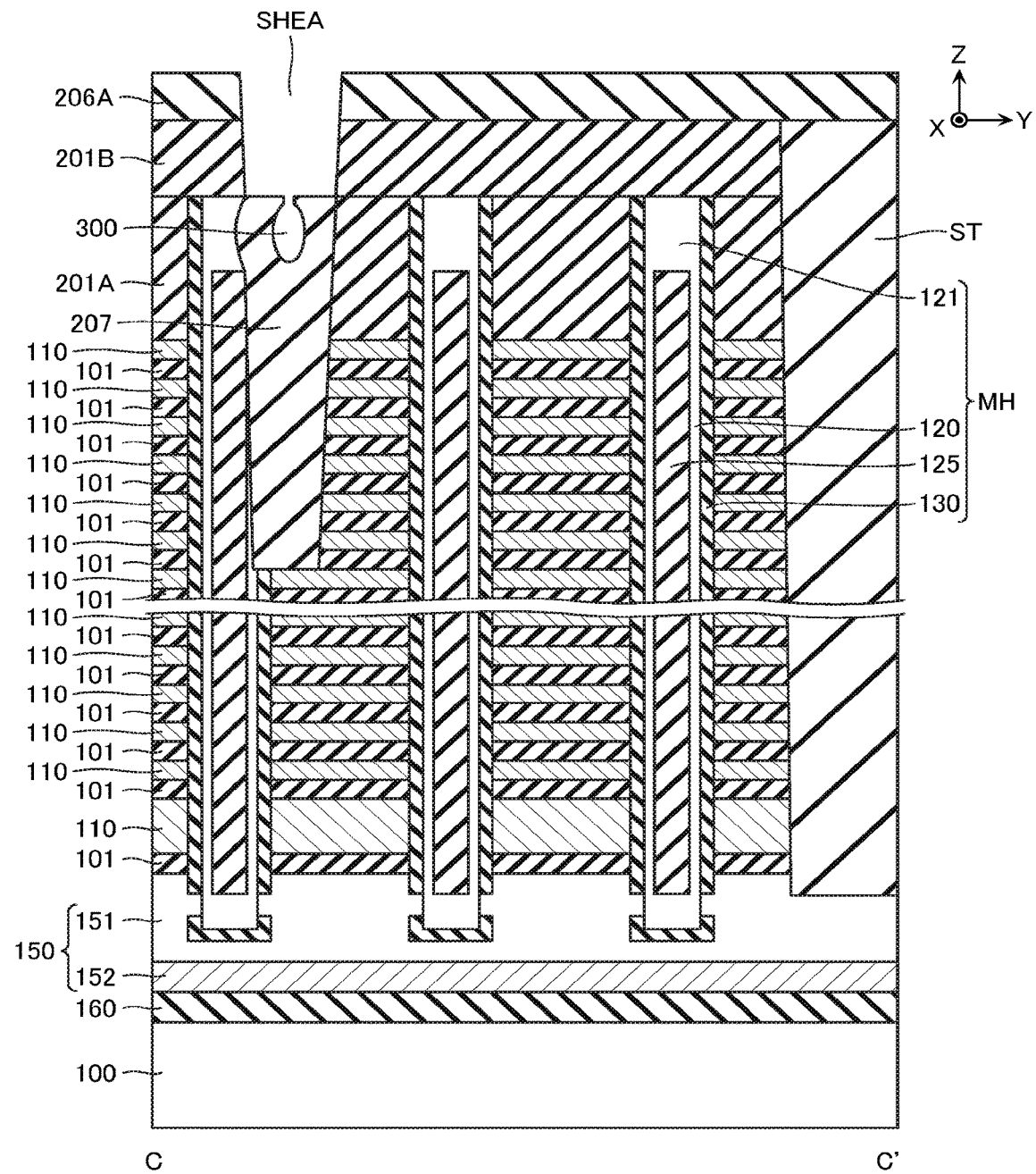
FIG. 26 is a schematic cross-sectional view illustrating the manufacturing method.

Subsequently, as illustrated in FIG. 26, the insulating layer 207A is dug down up to an upper end of the semiconductor layer 121 to form the third insulating layer 207. This process is performed by a method, such as RIE.

Figure 27:
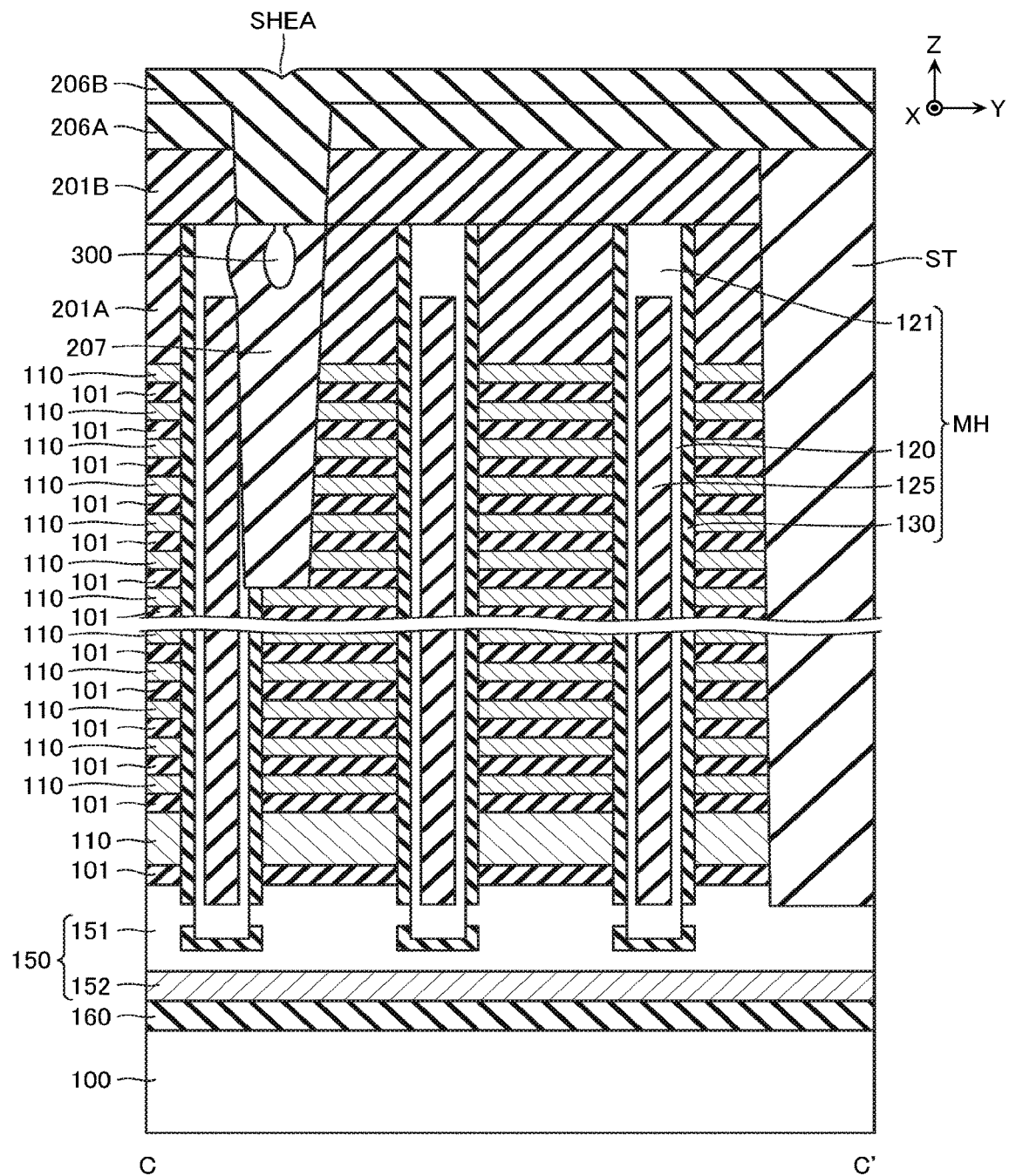
FIG. 27 is a schematic cross-sectional view illustrating the manufacturing method.

Subsequently, as illustrated in FIG. 27, an insulating layer 206B containing, for example, silicon nitride (SiN) and the like is formed on the third insulating layer 207 of the opening SHEA. This process is performed by a method, such as CVD.

Figure 28:
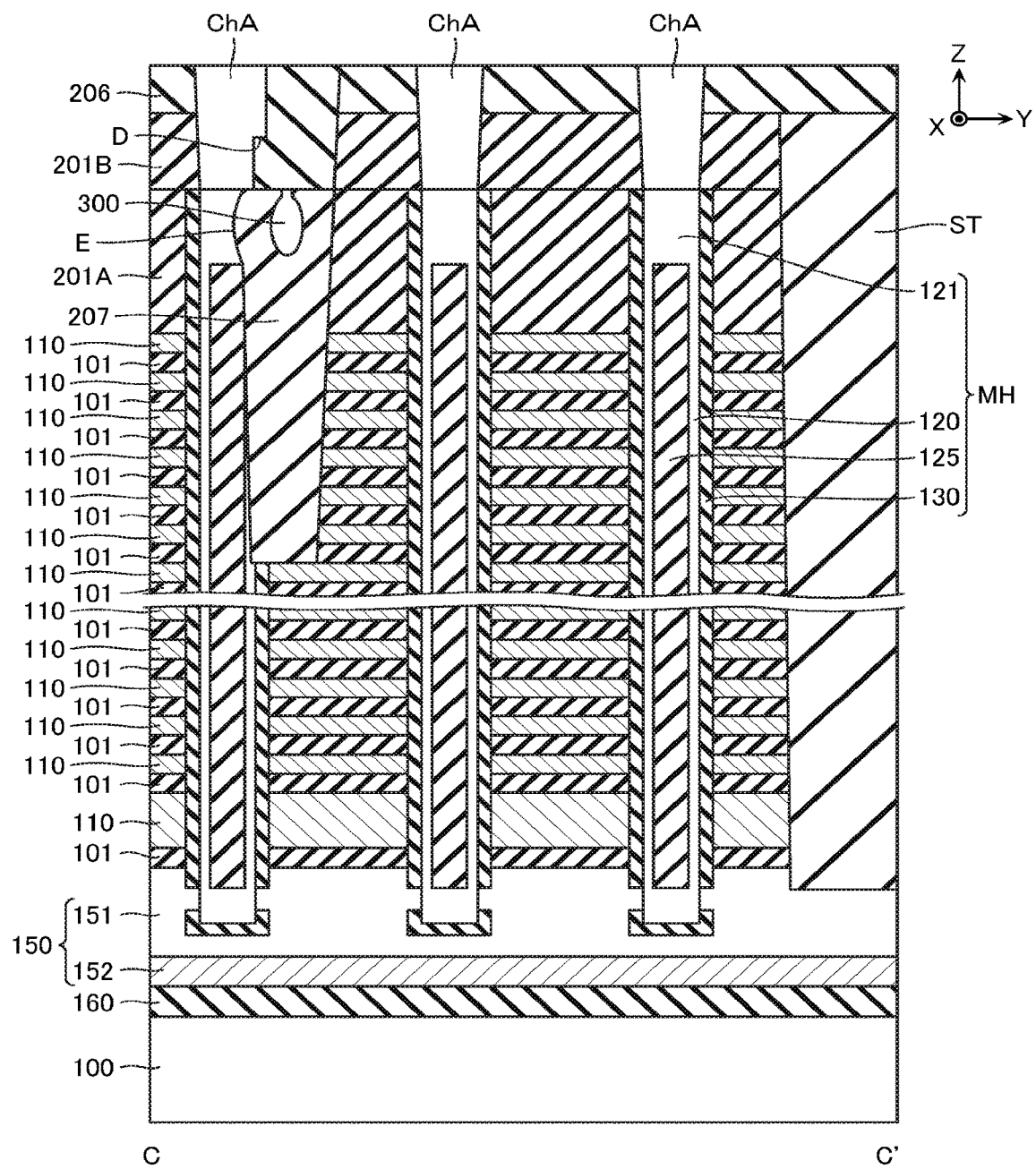
FIG. 28 is a schematic cross-sectional view illustrating the manufacturing method.

Subsequently, as illustrated in FIG. 28, after an upper surface of the insulating layer 206B is flattened by a method, such as CMP, the opening ChA for forming the contact Ch is formed on each of the memory structures MH. This process is performed by a method, such as RIE. In this case as well, the etching rate of the second insulating layer 206 is lower than that of the first insulating layer 201. Therefore, the opening ChA has a side surface in contact with the second insulating layer 206, and the step D due to the difference between the etching rates is formed on the side surface.

Accordingly, in the semiconductor memory device of the embodiment as well, the contact Ch does not penetrate into the seam 300.

According to this embodiment, the insulating portion SHE has the portion in contact with the memory structure MH, and the portion is entirely formed with the third insulating layer 207 as an oxide film. Therefore, the electric characteristics almost similar to those of the insulating portion SHE filled with a conventional oxide film can be maintained.

Third Embodiment

Figure 29:
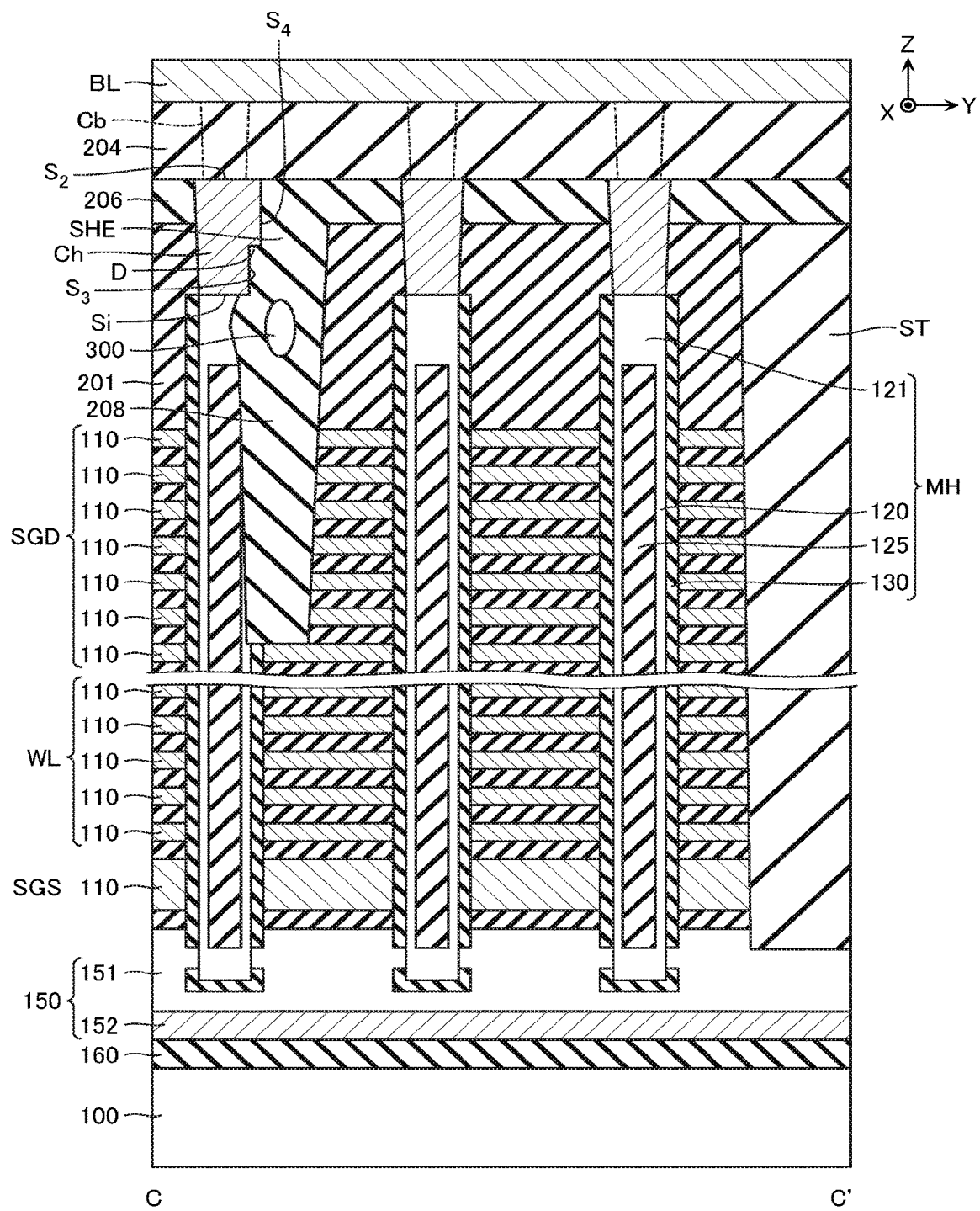
FIG. 29 is a schematic cross-sectional view of a semiconductor memory device according to a third embodiment.

FIG. 29 is a cross-sectional view of a semiconductor memory device according to a third embodiment and corresponds to a cross-sectional view taken along the C-C' line in FIG. 5 and viewed in the arrow direction.

In the third embodiment, the insulating portion SHE is formed of, for example, only a second insulating layer 208 containing silicon nitride (SiN) and the like. The second insulating layer 208 is in contact with the contacts Ch and the memory structures MH. An etching rate of the second insulating layer 208 is lower than that of the first insulating layer 201.

Figure 30:
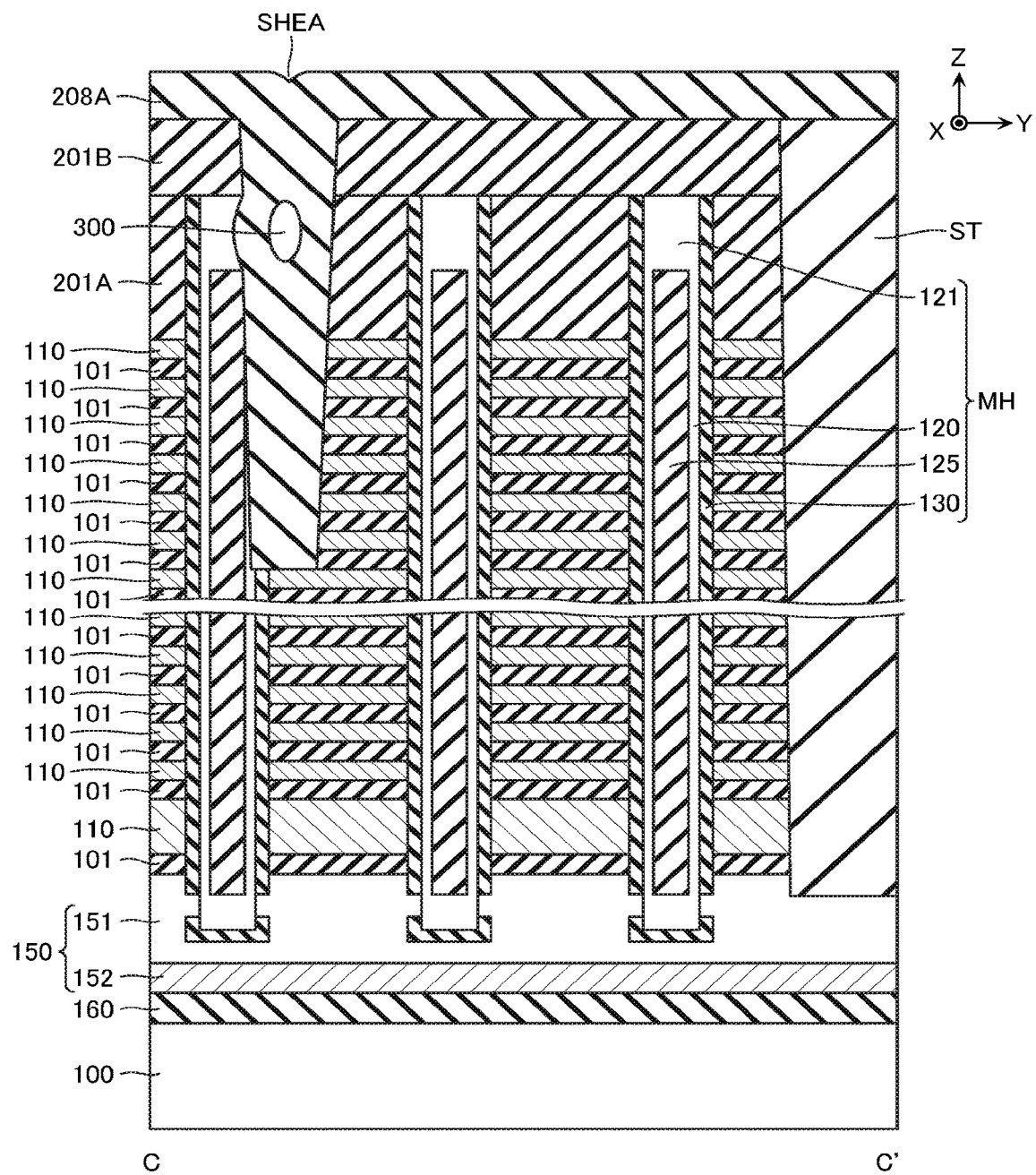
FIG. 30 is a schematic cross-sectional view illustrating a method for manufacturing the semiconductor memory device.
Figure 31:
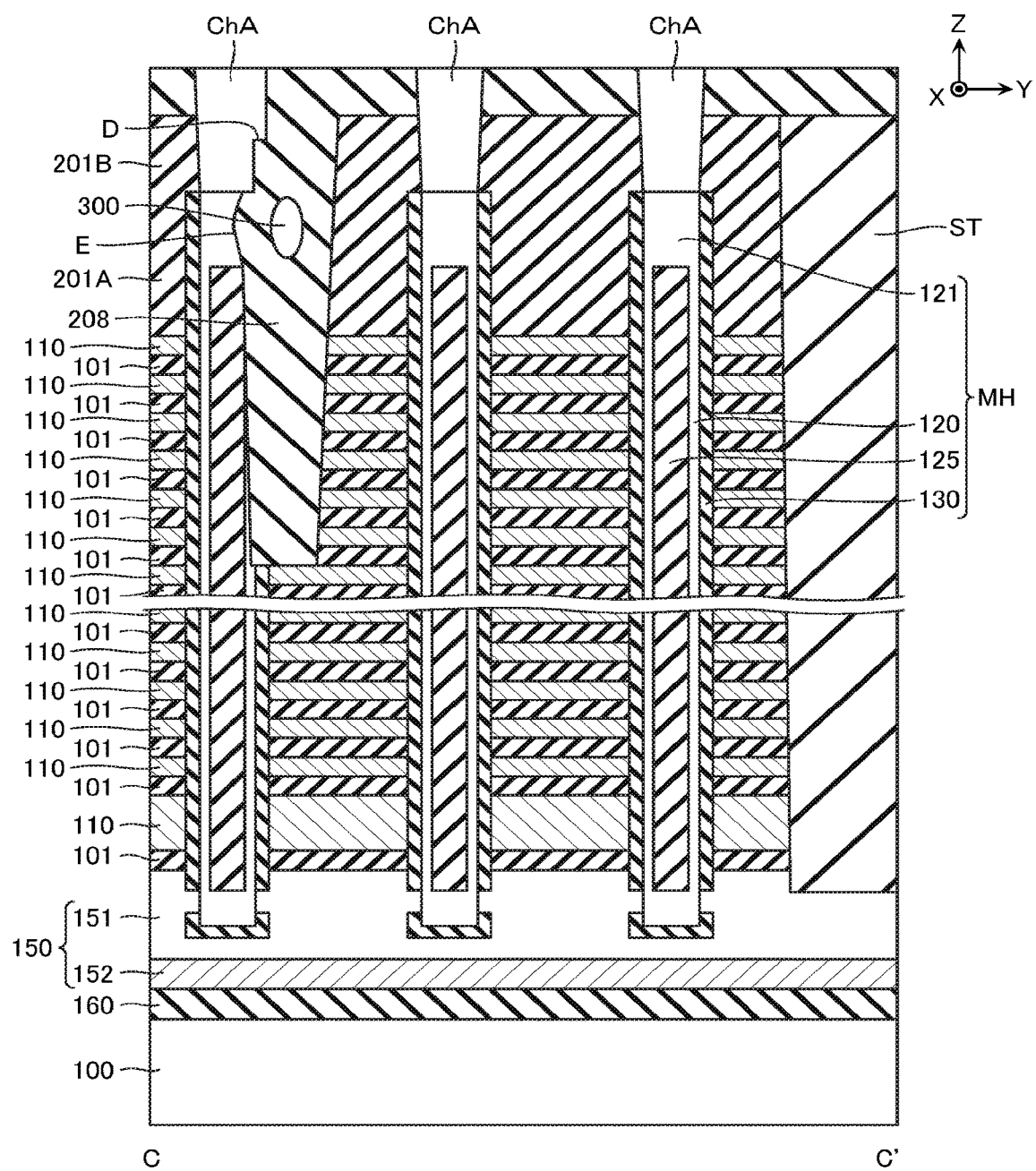
FIG. 31 is a schematic cross-sectional view illustrating the manufacturing method.

Next, a method for manufacturing the semiconductor memory device according to the embodiment is described with reference to FIG. 30 and FIG. 31. FIG. 30 and FIG. 31 illustrate cross-sectional surfaces corresponding to the C-C' line in FIG. 5.

The manufacturing process of the embodiment up to the formation of the opening SHEA illustrated in FIG. 18 is similar to that of the first embodiment. In this state, as illustrated in FIG. 30, for example, an insulating layer 208A containing silicon nitride (SiN) and the like is embedded inside the opening SHEA. This process is performed by a method, such as CVD. At this time, the insulating layer 208A has a portion opposed to the semiconductor layer 121, and the seam 300 is generated in the portion in some cases.

Subsequently, as illustrated in FIG. 31, after an upper surface of the insulating layer 208A is flattened by a method, such as CMP, the opening ChA for forming the contact Ch is formed on each of the memory structures MH. This process is performed by a method, such as RIE. In this case as well, an etching rate of the second insulating layer 208 is lower than that of the first insulating layer 201. Therefore, the opening ChA has a side surface in contact with the second insulating layer 208, and the step D due to the difference between the etching rates is formed on the side surface.

Accordingly, in the semiconductor memory device of the embodiment as well, the contact Ch does not penetrate into the seam 300.

In this embodiment, since the insulating portion SHE is formed of only a nitride film, the manufacturing process is simpler than those of the first and second embodiments.

Others

While certain embodiments have been described, these embodiments have been presented by way of example only, and are not intended to limit the scope of the inventions. For example, while the respective embodiments described above employ the silicon oxide film as the first insulating layer and the silicon nitride film as the second insulating layer, other materials can be employed as long as the first insulating layer and the second insulating layer are made of mutually different materials, an etching rate of the latter is lower than that of the former, and the materials are insulators. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first conductive layers disposed to be mutually separated in a first direction;
a first structure that includes a first semiconductor layer, a first gate insulating layer, and a second semiconductor layer, the first semiconductor layer extending in the first direction and being opposed to the plurality of first conductive layers, the first gate insulating layer being disposed between the first semiconductor layer and the plurality of first conductive layers, the second semiconductor layer being arranged in one end portion in the first direction of the first semiconductor layer and being connected to the first semiconductor layer;
a first contact connected to the second semiconductor layer of the first structure;
an insulating portion that separates a part of the plurality of first conductive layers in a second direction intersecting with the first direction and is directly in contact with the first semiconductor layer in the first structure and is in contact with the first contact from a first side in the second direction, the part of the plurality of first conductive layers being arranged on one end portion side in the first direction corresponding to the one end portion in the first direction of the first semiconductor layer among the plurality of first conductive layers; and
a first insulating layer in contact with the first contact from a second side opposite to the first side in the second direction, wherein
the insulating portion has a portion being directly in contact with the second semiconductor layer from a first position in the first direction corresponding to one end in the first direction of the second semiconductor layer to a second position in the first direction corresponding to the other end in the first direction of the second semiconductor layer, the portion being widened in the second direction between the first position and the second position,
the insulating portion includes an insulating material different from an insulating material of the first insulating layer, and
the insulating portion includes a seam, the seam being provided in a majority of a range in the first direction from the first position in the first direction to the second position in the first direction.

2. The semiconductor memory device according to claim 1, wherein
the insulating portion includes a second insulating layer in contact with at least the first contact, the second insulating layer including the insulating material different from the insulating material of the first insulating layer.

3. The semiconductor memory device according to claim 2, wherein
the insulating portion further includes a third insulating layer in contact with the first structure, the third insulating layer including an insulating material different from the insulating material of the second insulating layer.

4. The semiconductor memory device according to claim 3, wherein
the insulating portion includes the second insulating layer and the third insulating layer disposed below the second insulating layer, the second insulating layer being arranged at a third position in the first direction in contact with the first contact, the third insulating layer being arranged at a fourth position in the first direction in contact with the first structure.

5. The semiconductor memory device according to claim 2, wherein
an etching rate of the second insulating layer is lower than an etching rate of the first insulating layer.

6. The semiconductor memory device according to claim 2, wherein
the first insulating layer contains silicon oxide, and the second insulating layer contains silicon nitride.

7. The semiconductor memory device according to claim 1, wherein
the first contact includes a first end in contact with the second semiconductor layer and a second end positioned on a side opposite to the first end in the first direction, and the first contact includes a step on a side surface in contact with the insulating portion on the first side in the second direction, the side surface on the first end side being shifted to the second side in the second direction with respect to the side surface on the second end side.

8. The semiconductor memory device according to claim 1 further comprising:
a second structure that includes a third semiconductor layer, a second gate insulating layer, and a fourth semiconductor layer, the third semiconductor layer extending in the first direction and being opposed to the plurality of first conductive layers, the second gate insulating layer being disposed between the third semiconductor layer and the plurality of first conductive layers, the fourth semiconductor layer being arranged in one end portion in the first direction of the third semiconductor layer and being connected to the third semiconductor layer, the second structure being arranged adjacent to the first structure; and
a second contact connected to the fourth semiconductor layer of the second structure, wherein
the insulating portion is in contact with the first structure and the first contact and in contact with the second structure and the second contact,
the insulating portion separates the part of the plurality of first conductive layers between the first structure and the second structure in the second direction, and
the insulating portion includes a second insulating layer, the second insulating layer being in contact with at least the first contact and the second contact and including the insulating material different from the insulating material of the first insulating layer.

9. The semiconductor memory device according to claim 8, wherein
the insulating portion further includes a third insulating layer, the third insulating layer being in contact with the first structure and the second structure and including an insulating material different from the insulating material of the second insulating layer.

10. The semiconductor memory device according to claim 9, wherein
the insulating portion includes the second insulating layer and the third insulating layer disposed below the second insulating layer, the second insulating layer being arranged at a third position in the first direction in contact with the first contact and the second contact, the third insulating layer being arranged at a fourth position in the first direction in contact with the first structure and the second structure.

11. A semiconductor memory device comprising:
a plurality of first conductive layers disposed to be mutually separated in a first direction;
a structure that includes a first semiconductor layer, a gate insulating layer, and a second semiconductor layer, the first semiconductor layer extending in the first direction and being opposed to the plurality of first conductive layers, the gate insulating layer being disposed between the first semiconductor layer and the plurality of first conductive layers, the second semiconductor layer being arranged in one end portion in the first direction of the first semiconductor layer and being connected to the first semiconductor layer;
a contact connected to the second semiconductor layer of the structure;
an insulating portion that separates a part of the plurality of first conductive layers in a second direction intersecting with the first direction and is directly in contact with the first semiconductor layer in the structure and is in contact with the contact from a first side in the second direction, the part of the plurality of first conductive layers being arranged on one end portion side in the first direction corresponding to the one end portion in the first direction of the first semiconductor layer among the plurality of first conductive layers; and
a first insulating layer in contact with the contact from a second side opposite to the first side in the second direction, wherein
the insulating portion has a portion provided from a first position in the first direction corresponding to one end in the first direction of the second semiconductor layer to a second position in the first direction corresponding to the other end in the first direction of the second semiconductor layer, the portion being widened in the second direction between the first position and the second position,
the insulating portion has a side surface in contact with the contact on the second side in the second direction, the side surface of the insulating portion including a first side surface and a second side surface, the first side surface being close to the second semiconductor layer, the second side surface being farther from the second semiconductor layer than the first side surface, the first side surface projecting to the second side in the second direction with respect to the second side surface, and
the insulating portion includes a seam, the seam being provided in a majority of a range in the first direction from the first position in the first direction to the second position in the first direction.

12. The semiconductor memory device according to claim 11, wherein
the insulating portion includes a second insulating layer in contact with at least the contact and a third insulating layer in contact with the structure, the second insulating layer including an insulating material different from an insulating material of the first insulating layer, the third insulating layer including an insulating material different from the insulating material of the second insulating layer.

13. The semiconductor memory device according to claim 12, wherein
the insulating portion includes the second insulating layer and the third insulating layer disposed below the second insulating layer, the second insulating layer being arranged at a third position in the first direction in contact with the contact, the third insulating layer being arranged at a fourth position in the first direction in contact with the structure.

14. The semiconductor memory device according to claim 12, wherein
an etching rate of the second insulating layer is lower than an etching rate of the first insulating layer.

15. The semiconductor memory device according to claim 11, wherein
the portion of the insulating portion is directly in contact with the second semiconductor layer from the first position to the second position.

16. A semiconductor memory device comprising:
a plurality of first conductive layers disposed to be mutually separated in a first direction;
a plurality of structures each of that includes a first semiconductor layer, a gate insulating layer, and a second semiconductor layer, the first semiconductor layer extending in the first direction and being opposed to the plurality of first conductive layers, the gate insulating layer being disposed between the first semiconductor layer and the plurality of first conductive layers, the second semiconductor layer being arranged in one end portion in the first direction of the first semiconductor layer and being connected to the first semiconductor layer;
a contact connected to the second semiconductor layer in one of the plurality of structures; and
a silicon oxide layer: that separates a first plurality of first conductive layers among the plurality of first conductive layers in a second direction intersecting with the first direction, the first plurality of first conductive layers being arranged on one end portion side in the first direction corresponding to the one end portion in the first direction of the first semiconductor layer among the plurality of first conductive layers; that cuts out a part in the second direction on the one end portion side in the first direction of the first semiconductor layer in a first structure among the plurality of the structures; and that is directly in contact with the first semiconductor layer in the first structure, wherein
the silicon oxide layer includes a portion provided from a first position in the first direction corresponding to one end in the first direction of the second semiconductor layer to a second position in the first direction corresponding to the other end in the first direction of the second semiconductor layer,
a width in the second direction of the portion from the first position to the second position is larger than a width in the second direction of the silicon oxide layer at a position in the first direction corresponding to one of the first plurality of first conductive layers,
upper surfaces of the gate insulating layer and the second semiconductor layer in a remaining part in the second direction of the first structure partially cut out by the silicon oxide layer and an upper surface of a first portion of the silicon oxide layer disposed to partially cut out the first structure are flushed, and
the silicon oxide layer includes a seam, the seam being provided in a majority of a range in the first direction from the first position in the first direction to the second position in the first direction.

17. The semiconductor memory device according to claim 16, wherein
the upper surfaces of the gate insulating layer and the second semiconductor layer in the remaining part, the upper surface of the first portion of the silicon oxide layer and an upper surface of a second portion of the silicon oxide layer that does not overlap with the first structure in the first direction are flushed.

18. The semiconductor memory device according to claim 16, wherein
each of the plurality of structures further includes a core insulating layer disposed in its center position, and the silicon oxide layer is in contact with the core insulating layer in the first structure being partially cut out.

19. The semiconductor memory device according to claim 16, wherein
the silicon oxide layer is in contact with the first structure being partially cut out in the first direction and the second direction.

20. The semiconductor memory device according to claim 16, wherein
the plurality of structures include a different structure other than the first structure, the different structure being not cut out by the silicon oxide layer.

21. The semiconductor memory device according to claim 20, wherein
the different structure has a columnar shape, a columnar shaped contact hole is formed on the different structure, and the contact is disposed in the contact hole.

22. The semiconductor memory device according to claim 16, wherein
the portion of the silicon oxide layer is directly in contact with the second semiconductor layer from the first position to the second position.

* * * * *